United States Patent
Takahashi et al.

(10) Patent No.: US 8,507,907 B2
(45) Date of Patent: Aug. 13, 2013

(54) SEMICONDUCTOR MEMORY DEVICE

(75) Inventors: Yasuyuki Takahashi, Kanagawa (JP); Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 140 days.

(21) Appl. No.: 13/015,247

(22) Filed: Jan. 27, 2011

(65) Prior Publication Data
US 2011/0186837 A1 Aug. 4, 2011

(30) Foreign Application Priority Data

Jan. 29, 2010 (JP) ................................. 2010-019386

(51) Int. Cl.
*H01L 27/112* (2006.01)

(52) U.S. Cl.
USPC ....... 257/43; 367/149; 257/E29.068; 257/314

(58) Field of Classification Search
USPC ............................. 257/43, E29.068; 365/129
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,691,935 A * | 11/1997 | Douglass | 365/149 |
| 5,731,856 A | 3/1998 | Kim et al. | |
| 5,744,864 A | 4/1998 | Cillessen et al. | |
| 5,936,881 A | 8/1999 | Kawashima et al. | |
| 5,978,301 A | 11/1999 | Maeno et al. | |
| 6,051,851 A | 4/2000 | Ohmi et al. | |
| 6,127,702 A | 10/2000 | Yamazaki et al. | |
| 6,294,274 B1 | 9/2001 | Kawazoe et al. | |
| 6,442,065 B1 | 8/2002 | Hofmann et al. | |
| 6,446,177 B1 | 9/2002 | Tanaka et al. | |
| 6,563,174 B2 | 5/2003 | Kawasaki et al. | |
| 6,727,522 B1 | 4/2004 | Kawasaki et al. | |
| 6,873,009 B2 | 3/2005 | Hisamoto et al. | |

(Continued)

FOREIGN PATENT DOCUMENTS

| | | |
|---|---|---|
| EP | 0 828 295 A2 | 3/1998 |
| EP | 1 737 044 A1 | 12/2006 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Matthew Landau
*Assistant Examiner* — Edward Chin
(74) *Attorney, Agent, or Firm* — Fish & Richardson P.C.

(57) ABSTRACT

It is to provide a semiconductor memory device in which high voltage is not needed in writing, a defect is less likely to occur, the writing time is short, and data cannot be rewritten without an increase in cost. The semiconductor memory device includes a memory element which includes a diode-connected first transistor, a second transistor whose gate is connected to one terminal of a source electrode and a drain electrode of the diode-connected first transistor, and a capacitor connected to the one terminal of the source electrode and the drain electrode of the diode-connected first transistor and the gate of the second transistor.

12 Claims, 26 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,106 B2 | 8/2010 | Chang |
| 7,791,074 B2 | 9/2010 | Iwasaki |
| 7,935,582 B2 | 5/2011 | Iwasaki |
| 8,207,756 B2* | 6/2012 | Shionoiri et al. ............... 326/98 |
| 2001/0046027 A1 | 11/2001 | Tai et al. |
| 2002/0047826 A1 | 4/2002 | Akimoto et al. |
| 2002/0056838 A1 | 5/2002 | Ogawa |
| 2002/0075723 A1 | 6/2002 | Hofmann et al. |
| 2002/0132454 A1 | 9/2002 | Ohtsu et al. |
| 2003/0189401 A1 | 10/2003 | Kido et al. |
| 2003/0209739 A1 | 11/2003 | Hisamoto et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1* | 10/2006 | Kimura ............... 315/169.3 |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097338 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0276689 A1 | 11/2010 | Iwasaki |
| 2012/0091321 A1* | 4/2012 | Tanaka et al. ............... 250/208.2 |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 07-297293 A | 11/1995 |
| JP | 08-264794 A | 10/1996 |
| JP | 10-084092 A | 3/1998 |
| JP | 11-126491 A | 5/1999 |
| JP | 11-505377 A | 5/1999 |
| JP | 2000-044236 A | 2/2000 |
| JP | 2000-150900 A | 5/2000 |
| JP | 2001-028443 A | 1/2001 |
| JP | 2001-035176 A | 2/2001 |
| JP | 2002-076356 A | 3/2002 |
| JP | 2002-082656 A | 3/2002 |
| JP | 2002-289859 A | 10/2002 |
| JP | 2002-538572 A | 11/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-103918 A | 4/2007 |
| JP | 2008-042067 A | 2/2008 |
| JP | 2009-033145 A | 2/2009 |
| JP | 2009-182194 A | 8/2009 |
| WO | 2004/114391 A1 | 12/2004 |
| WO | 2007/029844 A1 | 3/2007 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel using IGZO Oxide TFT," SID Digest '08 : SID International Symposium Digest of Technical Papers, May 20, 2008, vol. 39, pp. 625-628

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of The 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of The 9th International Display Workshops, Dec. 4, 2002, pp. 295-298.

Ueno, K et al., "Field-Effect Transister on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/073903, dated Apr. 12, 2011, 5 pages.

Written Opinion, PCT Application No. PCT/JP2010/073903, dated Apr. 12, 2011, 6 pages.

* cited by examiner

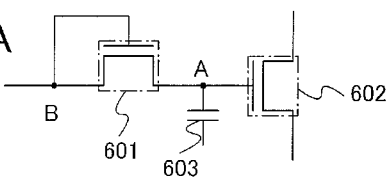
FIG. 20A
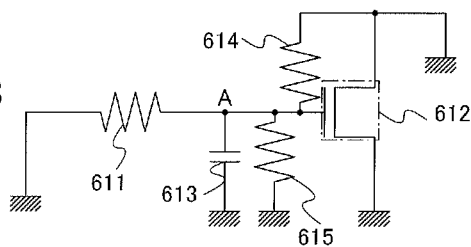
FIG. 20B
FIG. 20C
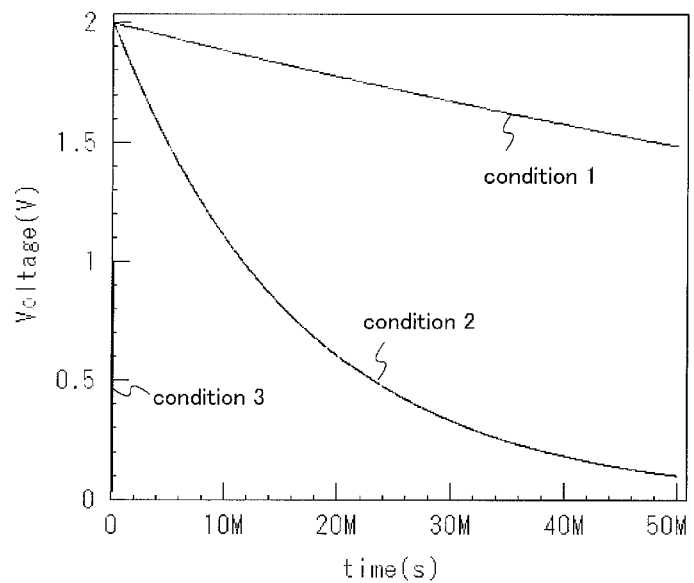

SEMICONDUCTOR MEMORY DEVICE

TECHNICAL FIELD

The present invention relates to semiconductor memory devices and to a manufacturing method thereof.

BACKGROUND ART

In recent years, most electronic devices such as computers can perform desired operations by using a variety of data. When the data is held in, for example, a semiconductor memory device (also referred to as a memory) or the like, the data can be used temporarily or permanently.

A semiconductor memory device also includes an external memory device (an auxiliary memory device) such as a hard disk or a flexible disk in a broad sense. However, a semiconductor memory device almost always refers to a semiconductor memory device such as a CPU (central processing unit).

Two main types of semiconductor memory devices are a volatile memory and a nonvolatile memory. A volatile memory refers to a semiconductor memory device in which data is lost when the power is turned off. In addition, a nonvolatile memory is a semiconductor memory device in which data is continuously held even after power is turned off and in which data can be held semi-permanently after the data is written.

Although a volatile memory has a possibility of losing data, it has an advantage of short access time. In addition, although a nonvolatile memory can hold data, it has a disadvantage of high power consumption. Semiconductor memory devices each have features in this manner, and each of the semiconductor memory devices is used in accordance with the kind or usage of data.

There are various kinds of nonvolatile memories such as an unwritable read only memory (ROM), a flash memory in which writing and erasing can be performed multiple times, and an electronically erasable and programmable read only memory (EEPROM). Of these, a write-once memory in which writing can be performed only once is preferable because data is difficult to falsify and high security can be provided in this memory.

An example of a write-once memory is an anti-fuse type memory in which voltage is applied to both terminals of an element formed using amorphous silicon to form silicide in the terminals and to short-circuit. Further, a rewritable memory such as a flash memory or an EEPROM is used and a memory region where erasure is not performed is provided, whereby the rewritable memory is logically used as a write-once memory in some cases (see Patent Document 1).
[Reference]
Patent Document 1: Japanese Published Patent Application No. H7-297293

DISCLOSURE OF INVENTION

However, in a conventional write-once memory, there is a problem in that high-voltage writing is needed. It is necessary to apply voltage which is larger than voltage used for reading operation in order to make a permanent change in a memory element in the write-once memory. For example, in writing, a silicide-type write-once memory in which silicide is used as a memory element needs a voltage of 6 V to 8 V, whereas a voltage of 15 V to 18 V is needed when the flash memory or the EEPROM is used as a write-once memory. Accordingly, a boosting circuit is necessary for generation of such a high potential; therefore, power consumption in writing increases.

In order to apply high voltage to the memory element, it is also necessary to apply high-potential voltage to a peripheral circuit such as a decoder in writing. Consequently, in order to increase withstand voltage so that the peripheral circuit may withstand high voltage, an increase in a channel length, formation of an LDD region, and the like should be performed, which increases the number of manufacturing steps and hinders high integration.

In some cases, the silicide-type write-once memory becomes in a semi-short-circuit state with high resistance (the state in which resistance is high such that data is not recognized as data 1 described later by a reading operation) due to shortage of writing voltage or the like. An element which becomes a semi-short-circuit state with high resistance is a substantially defective element.

In addition, the silicide-type write-once memory cannot write data in a plurality of memory cells at the same time, and it is difficult to write data in many memory elements in a short time. Further, in the case of the flash memory or the EEPROM, it is possible to write data in a plurality of memory cells at the same time, but the writing time is as long as approximately 100 μs.

In the flash memory or the EEPROM which can be used as a write-once memory by the operation of a logic circuit, data stored in the write-once memory might be rewritten due to the malfunction of the logic circuit. In particular, when a rewritable memory and a write-once memory in a semiconductor memory device are formed using memory cells having the same structure, this problem easily occurs. Further, malfunction of the logic circuit might occur by the operation of a malicious user, and data in the write-once memory might be falsified.

In view of the above problems, an object of one embodiment of the present invention is to provide a semiconductor memory device in which high voltage is not needed in writing, a defect is less likely to occur, the writing time is short, and data cannot be rewritten without an increase in cost.

One embodiment of the present invention is a semiconductor memory device including a memory element which includes a diode-connected first transistor and a second transistor whose gate is connected to one terminal of a source electrode and a drain electrode of the diode-connected first transistor. Note that one terminal of a source electrode and a drain electrode of the second transistor and the one terminal of the source electrode and the drain electrode of the diode-connected first transistor form a parasitic capacitance.

Another embodiment of the present invention is a semiconductor memory device including a memory element which includes a diode-connected first transistor, a second transistor whose gate is connected to one terminal of a source electrode and a drain electrode of the diode-connected first transistor, and a capacitor connected to the one terminal of the source electrode and the drain electrode of the diode-connected first transistor and the gate of the second transistor.

When the second transistor is on, that is, voltage higher than threshold voltage is applied to the gate thereof, a state of writing data is set. When the second transistor is off, that is, voltage lower than the threshold voltage is applied to the gate thereof, a state of non-writing data is set. One terminal of the source electrode and the drain electrode of the diode-connected first transistor functions as an anode. When a channel region of the diode-connected first transistor is formed using an oxide semiconductor, whereby off-state current can be reduced to less than or equal to $1\times10^{-19}$ A/μm, and further, less than or equal to $1\times10^{-20}$ A/μm. Therefore, a potential of the gate of the second transistor which rises by writing of data, or the potential of the gate of the second transistor and the capacitor, which rises by writing of data, is less likely to leak from the diode-connected first transistor, and the potential of the gate of the second transistor can be held. In other words, the data which is written once can be held.

Therefore, the writing voltage can be set to voltage with which the second transistor can be turned on, that is, greater than or equal to the threshold voltage of the second transistor, and the writing voltage can be reduced. A boosting circuit for writing voltage is not necessarily provided. Power consumption in writing can be reduced, and an increase in a channel length for higher withstand voltage and formation of an LDD region are unnecessary. Therefore, the size of a memory element can be reduced, and high integration can be achieved.

Unlike the silicide-type write-once memory, a memory element can be formed using a transistor; therefore, writing defects can be reduced.

In a semiconductor memory device of one embodiment of the present invention, the writing time is determined by the on-state current of the diode-connected first transistor and the capacitance of the capacitor, and writing of data is finished in approximately 1 μs even when the on-state current of the first transistor is $10^{-6}$ A and the capacitance of the capacitor is 1 pF. Further, writing of data in a plurality of memory elements can be performed at the same time. Therefore, the writing time is greatly reduced.

The memory cell included in a semiconductor memory device of one embodiment of the present invention is a write-once memory; therefore, rewriting of data due to the malfunction of a logic circuit does not occur. In addition, a rewritable memory can be formed only by modification in the wiring layout of the memory element in the write-once memory; therefore, a semiconductor memory device in which a rewritable memory and a write-once memory are combined can be formed. Accordingly, the security of holding data in the semiconductor memory device can be improved.

A semiconductor memory device in which high voltage is not needed in writing, a defect is less likely to occur, the writing time is short, and data cannot be rewritten can be formed without an increase in cost.

BRIEF DESCRIPTION OF DRAWINGS

FIGS. 20A to 20C are equivalent circuits used for simulation and a graph showing results thereof.

BEST MODE FOR CARRYING OUT THE INVENTION

Figure 1A:
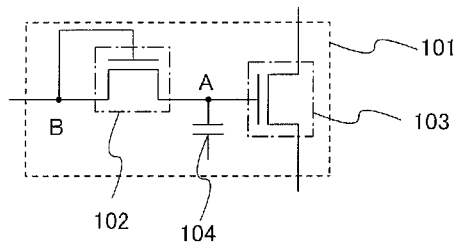
FIGS. 1A and 1B are equivalent circuits each illustrating a semiconductor memory device according to one embodiment of the present invention.

Hereinafter, the embodiments and the examples of the present invention will be described with reference to the accompanying drawings. Note that the present invention is not limited to the following description, and those skilled in the art can easily understand that modes and details of the present invention can be changed in various ways without departing from the spirit and scope of the present invention. Therefore, the present invention should not be limited to the descriptions of the embodiments and the examples below. In describing structures of the present invention with reference to the drawings, reference numerals denoting the same components are used in different drawings.

Note that the size, the thickness of a layer, and a region of each structure illustrated in the drawings and the like in the embodiments and the examples are exaggerated for simplicity in some cases. Therefore, the embodiments and the examples of the present invention are not limited to such scales.

Note that terms with ordinal numbers such as "first", "second", and "third" in this specification are used in order to identify components, and the terms do not limit the components numerically.

In addition, voltage refers to a potential difference between a given potential and a reference potential (e.g., a ground potential) in many cases. Accordingly, voltage, potential, and a potential difference can be referred to as potential, voltage, and a voltage difference, respectively.

Note that both a source electrode and a drain electrode in a transistor are connected to a semiconductor layer. Current flows in accordance with a potential difference between the source electrode and the drain electrode when voltage is applied to a gate electrode; therefore, the source electrode and the drain electrode may be exchanged for each other depending on an operation, and it is sometimes difficult to identify where a source electrode and a drain electrode are from their positions. Thus, when a structure of a transistor is described, names "source electrode" and "drain electrode" are used. Alternatively, names "one of a source electrode and a drain electrode" and "the other of the source electrode and the drain electrode" are used. Further alternatively, names "first electrode" and "second electrode" are used. Note that there is no particular difference in meaning depending on such names.

(Embodiment 1)

In this embodiment, a structure of a semiconductor memory device which is one embodiment of the present invention will be described with reference to drawings. Note that in this embodiment, the case where an n-channel transistor in which electrons are majority carriers is used is described; it is needless to say that a p-channel transistor in which holes are majority carriers can be used instead of the n-channel transistor.

Figure 1B:
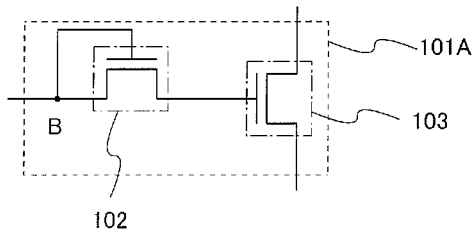

A memory element which is one embodiment of the present invention is illustrated in each of FIGS. 1A and 1B. A memory element 101 illustrated in FIG. 1A includes a diode-connected transistor 102, a transistor 103, and a capacitor 104. A gate of the transistor 103 is connected to a first electrode of the capacitor 104 and a first electrode of the transistor 102. A second electrode of the transistor 102 is connected to a gate of the transistor 102. Here, a connection region where the gate of the transistor 103, the first electrode of the capacitor 104, and the first electrode of the transistor 102 are connected is referred to as a node A, whereas a connection region where the second electrode of the transistor 102 and the gate thereof are connected is referred to as a node B.

In the memory element described in this embodiment, the first electrode of the diode-connected transistor 102 functions as an anode. A channel region of the diode-connected transistor 102 is formed using an oxide semiconductor. The transistor 102 including an oxide semiconductor in the channel region has low off-state current. The transistor 102 is diode-connected, and the gate of the transistor 102 is connected to the second electrode of the transistor 102. Therefore, current flows from the node B to the node A when the transistor 102 is on; however, current which flows from the node A to the node B is extremely small when the transistor 102 is off.

Here, in the memory element 101, a state in which the potential of the node A is low (that is, the transistor 103 is turned off) is data 0, whereas a state in which the potential of the node A is high (that is, the transistor 103 is turned on) is data 1.

The diode-connected transistor 102 is on, and the voltage which is higher than the threshold voltage of the transistor 103 is charged in the capacitor 104, that is, voltage which makes the transistor 103 turn on is applied to the node A, whereby data 1 can be written to the memory element 101.

On the other hand, after the writing of data is finished, the transistor 102 is turned off. Even when the potential of the node B where the gate of the transistor 102 is connected to the second electrode thereof decreases, the transistor 102 has very low off-state current and is diode-connected; therefore, current is less likely to flow from the first electrode of the transistor 102 to the second electrode thereof. Accordingly, voltage charged in the node A does not decrease, and voltage of the node A can be held for a long period of time. Consequently, written information (data 1) cannot be rewritten, and the memory element 101 can be operated as a write-once memory substantially. Note that the capacitance of the capacitor 104 is set as appropriate in accordance with the required retention time of data.

Note that when a parasitic capacitance is formed in a first electrode or a second electrode of the transistor 103 and the first electrode of the diode-connected transistor 102, the capacitor 104 is not necessarily provided. The memory element in that case includes the diode-connected transistor 102 and the transistor 103, and the gate of the transistor 103 is connected to the first electrode of the transistor 102, as illustrated in FIG. 1B. In addition, the second electrode of the transistor 102 is connected to the gate of the transistor 102.

Figure 2A:
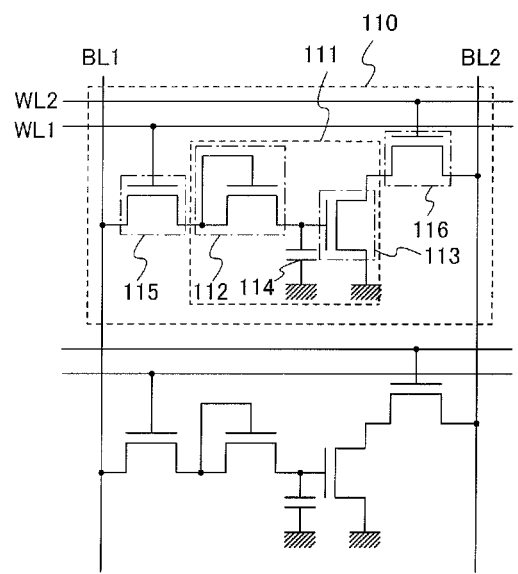
FIGS. 2A and 2B are equivalent circuits each illustrating a semiconductor memory device according to one embodiment of the present invention.
Figure 2B:
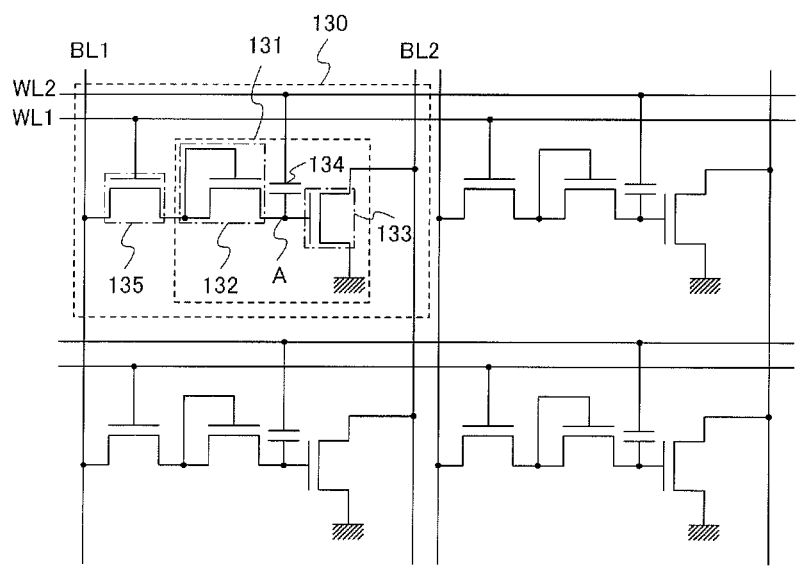
Figure 3:
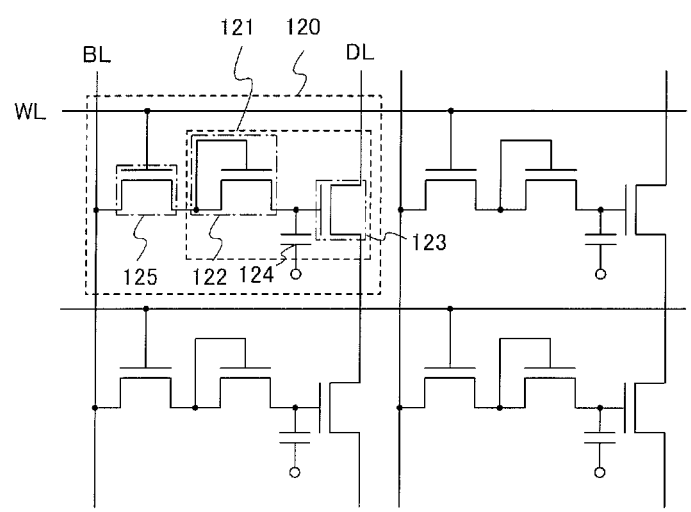
FIG. 3 is an equivalent circuit illustrating a semiconductor memory device according to one embodiment of the present invention.

Next, an embodiment of a memory cell array in which memory cells each having the memory element of FIG. 1A are arranged in matrix is illustrated in each of FIGS. 2A and 2B and FIG. 3.

FIG. 2A is a diagram illustrating one embodiment of a NOR memory cell array.

A memory cell 110 includes a memory element 111; a transistor 115 whose gate is connected to a word line WL1 for writing, whose first electrode is connected to the memory element 111, and whose second electrode is connected to a bit line BL1 for writing; and a transistor 116 whose gate is connected to a word line WL2 for reading, whose first electrode is connected to a bit line BL2 for reading, and whose second electrode is connected to the memory element 111. The transistor 115 functions as a selection transistor for writing, and the transistor 116 functions as a selection transistor for reading.

The memory element 111 includes a diode-connected transistor 112, a transistor 113, and a capacitor 114. A second electrode of the transistor 112 is connected to a gate thereof and is connected to the first electrode of the transistor 115. A gate of the transistor 113 is connected to a first electrode of the capacitor 114 and a first electrode of the transistor 112. In addition, a first electrode of the transistor 113 is connected to the second electrode of the transistor 116, and a second electrode of the transistor 113 has a fixed potential. A second electrode of the capacitor 114 also has a fixed potential.

FIG. 2B is a diagram illustrating one embodiment of a NOR memory cell array which is different from that in FIG. 2A.

A memory cell 130 includes a memory element 131; and a transistor 135 whose gate is connected to the word line WL1 for writing, whose first electrode is connected to the memory element 131, and whose second electrode is connected to the bit line BL1 for writing. The transistor 135 functions as a selection transistor for writing.

The memory element 131 includes a diode-connected transistor 132, a transistor 133, and a capacitor 134. A second electrode of the transistor 132 is connected to a gate thereof and is connected to the first electrode of the transistor 135. A gate of the transistor 133 is connected to a first electrode of the capacitor 134 and a first electrode of the transistor 132. A first electrode of the transistor 133 is connected to the bit line BL2 for reading, and a second electrode thereof has a fixed potential. A second electrode of the capacitor 134 is connected to the word line WL2 for reading.

FIG. 3 is a diagram illustrating one embodiment of a NAND memory cell array.

A memory cell 120 includes a memory element 121; and a transistor 125 whose gate is connected to a word line WL for writing, whose first electrode is connected to the memory element 121, and whose second electrode is connected to a bit line BL for writing. The transistor 125 functions as a selection transistor for writing.

The memory element 121 includes a diode-connected transistor 122, a transistor 123, and a capacitor 124. A second electrode of the transistor 122 is connected to a gate thereof and is connected to the first electrode of the transistor 125. A gate of the transistor 123 is connected to a first electrode of the capacitor 124 and a first electrode of the transistor 122. A first electrode of the transistor 123 is connected to a data line DL for reading, and a second electrode of the transistor 123 is connected to a first electrode of the transistor 123 of the next line. A second electrode of the capacitor 124 has a fixed potential.

Channel regions of the diode-connected transistors 112, 122, and 132 are each formed using an oxide semiconductor. The transistors 112, 122, and 132 each including an oxide semiconductor in the channel region have low off-state current. The transistors 112, 122, and 132 are diode-connected, and the gates of the transistors 112, 122, and 132 are connected to the second electrodes of the transistors 112, 122, and 132, respectively. Therefore, current flows from the node B to the node A when the transistors 112, 122, and 132 are on; however, extremely small current flows from the node A to the node B when the transistors 112, 122, and 132 are off.

Each of channel regions of the transistors 113, 115, 116, 123, 125, 133, and 135 can be formed using any of an amorphous silicon layer, a micro-crystalline silicon layer, a polysilicon layer, and a single crystal silicon layer. In a manner similar to that in which the diode-connected transistors 112, 122, and 132 are formed, each of the channel regions of the transistors 113, 115, 116, 123, 125, 133, and 135 may be formed using an oxide semiconductor.

In the semiconductor memory device described in this embodiment, the channel region of the diode-connected first transistor is formed using an oxide semiconductor, whereby off-state current can be reduced to less than or equal to $1\times10^{-19}$ A/μm, and further, less than or equal to $1\times10^{-20}$ A/μm. Therefore, the potential of the gate of the second transistor and the capacitor, which rises by writing of data, is less likely to leak from the diode-connected first transistor, and the potential of the gate of the second transistor can be held. In other words, the data which is written once can be held.

The data writing voltage can be set to voltage with which the second transistor can be turned on, that is, greater than or equal to the threshold voltage of the second transistor, and the writing voltage can be reduced. A boosting circuit for writing voltage is not necessarily provided. Power consumption in writing can be reduced, and an increase in a channel length for higher withstand voltage and formation of an LDD region are unnecessary. Therefore, the size of a memory element can be reduced, and high integration can be achieved.

The writing time of the semiconductor memory device described in this embodiment is determined by the on-state current of the diode-connected first transistor and the capacitance of the capacitor, and writing of data is finished in approximately 1 μs in the case where the on-state current of the first transistor is $10^{-6}$ A and the capacitance of the capacitor is 1 pF. Further, writing of data in a plurality of memory elements can be performed at the same time. Therefore, the writing time can be greatly reduced.

The memory cell included in the semiconductor memory device described in this embodiment is a write-once memory; therefore, rewriting of data due to the malfunction of a logic circuit does not occur. Accordingly, the security of holding data in the semiconductor memory device can be improved.

Note that the memory cell and the memory cell array which are described in this embodiment are one embodiment, and the structures are not limited thereto.

(Embodiment 2)

In this embodiment, writing and reading of data in the semiconductor memory device described in Embodiment 1 will be described with reference to drawings.

Figure 4A:
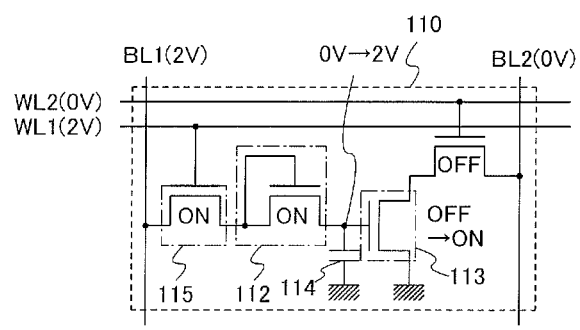
FIGS. 4A and 4B are equivalent circuits each illustrating a semiconductor memory device according to one embodiment of the present invention.

The writing of data in the NOR memory cell 110 illustrated in FIG. 2A will be described with reference to FIG. 4A.

First, a first potential is applied to the bit line BL1 for writing and the word line WL1 for writing, which are connected to the memory cell 110 in which data is written, and the bit line BL2 for reading and the word line WL2 for reading are each set at a ground potential. The first potential is a potential at which the transistors 113 and 115 are turned on. The first potential is a potential which is higher than the threshold voltage of each of the transistors 113 and 115, and is 2 V here.

When the potential of the word line WL1 for writing is the first potential, the transistor 115 functioning as a selection transistor for writing and the diode-connected transistor 112 are turned on, so that the potential of the node A, that is, the potential of the capacitor 114 and the gate of the transistor 113, increases to approximately the same as the potential of the bit line BL1 for writing; accordingly, the transistor 113 is turned on. Through the above steps, data 1 can be written.

Note that as long as electric charge enough to turn on the transistor 113 is charged in the node A in order to write data 1, a boosting circuit for writing data is unnecessary, and the writing voltage is applied to a logic circuit which drives the memory cell 110 from a power source. Time enough to charge the capacitor 104 is sufficient as the writing time; therefore, when the on-state current of the transistors 112 and 115 is $10^{-6}$ A and the capacitance of the capacitor 114 is 1 pF, writing of data is finished in a short time of approximately 1 μs.

Figure 4B:
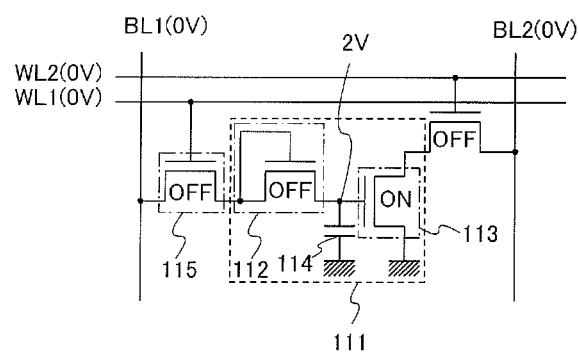

After the writing of data is finished, the potential of the bit line BL1 for writing and the potential of the word line WL1 for writing are 0 V as illustrated in FIG. 4B. Accordingly, although the transistor 115 functioning as a selection transistor for writing and the diode-connected transistor 112 are off, the off-state current of the transistor 112 which is formed using an oxide semiconductor is very low; therefore, the voltage of the node A is held for a long period of time. Specifically, the off-state current of the transistor 112 formed using an oxide semiconductor is less than or equal to $1\times10^{-19}$ A/μm, preferably less than or equal to $1\times10^{-20}$ A/μm. Therefore, when a capacitance of 1 pF is added to the capacitor 114, data can be held for 20 days to 200 days, and the memory element 111 functions as a write-once memory. Note that "to hold data" here means a state in which the potential of the capacitor 114 is greater than or equal to 90% of the potential in writing of data 1, namely, greater than or equal to 1.8 V.

Figure 5A:
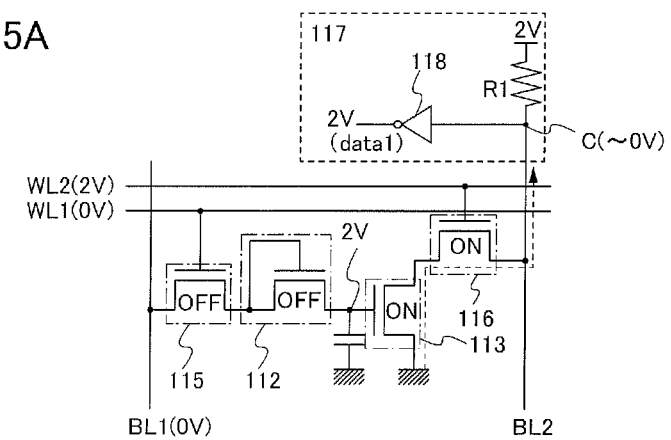
FIGS. 5A and 5B are equivalent circuits each illustrating a semiconductor memory device according to one embodiment of the present invention.
Figure 5B:
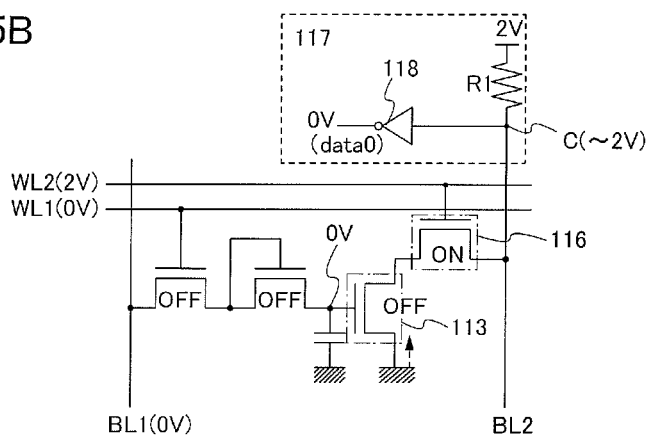

Next, reading of data in the memory cell 110 illustrated in FIG. 2A will be described with reference to FIGS. 5A and 5B. FIG. 5A illustrates a method for reading data 1, and FIG. 5B illustrates a method for reading data 0. In reading of data, the potential of the word line WL2 for reading is changed to turn on the transistor 116 functioning as a selection transistor for reading, so that an output from a readout circuit 117 is determined in accordance with the voltage of the bit line BL2 for reading. Note that the bit line BL1 for writing and the word line WL1 for writing are each set at a ground potential in reading, and the transistors 112 and 115 are off.

In the case of reading data 1, a second potential is applied to the word line WL2 for reading which belongs to a column through which data is read, and the transistor 116 is turned on as illustrated in FIG. 5A. A third potential which is a negative potential is also applied to word lines WL2 for reading which belong to columns through which data is not read. The second potential is a potential at which the transistor 116 is turned on. The second potential is set as a potential which is higher than the threshold voltage of the transistor 116, and is 2 V here. In the case of data 1, the transistor 113 is turned on therefore, the output from the readout circuit 117 is determined by comparison between resistance of a resistor (referred to as R1) included in the readout circuit 117 and the sum of on-resistance of the transistor 113 and on-resistance of the transistor 116. Here, when the resistance of the resistor R1 in the readout circuit is higher than the sum of the on-resistance of the transistor 113 and the on-resistance of the transistor 116, the potential of a node C of the bit line BL2 for reading is approximately 0 V. The potential of the node C is inverted by an inverter 118 included in the readout circuit 117 to be output as data 1.

In the case of reading data 0, the second potential is applied to the word line WL2 for reading, and the transistor 116 is turned on as illustrated in FIG. 5B. In the case of data 0, the transistor 113 is off; therefore, the output from the readout circuit 117 is determined by comparison between the resistance of the resistor R1 included in the readout circuit 117 and the sum of off-resistance of the transistor 113 and on-resistance of the transistor 116. Here, when the resistance of the resistor R1 included in the readout circuit 117 is lower than the sum of the off-resistance of the transistor 113 and the on-resistance of the transistor 116, the potential of the node C of the bit line BL2 for reading is set to approximately 2 V by the readout circuit 117. The potential is inverted by the inverter 118 included in the readout circuit 117 to be output as data 0.

Note that in memory cells which belong to columns through which data is not read, the third potential which is a negative potential is applied to word lines WL2 for reading. The third potential is a potential at which the transistor 116 is turned off. The third potential is a negative potential which is lower than the threshold voltage of the transistor 116, and is −2 V here. The transistor 116 is turned off. Therefore, there is no possibility of reading data in the memory cells in which reading of data is not selected.

Next, writing and reading of data in the NOR memory cell 130 illustrated in FIG. 2B according to Embodiment 1 will be described with reference to drawings.

Figure 6:
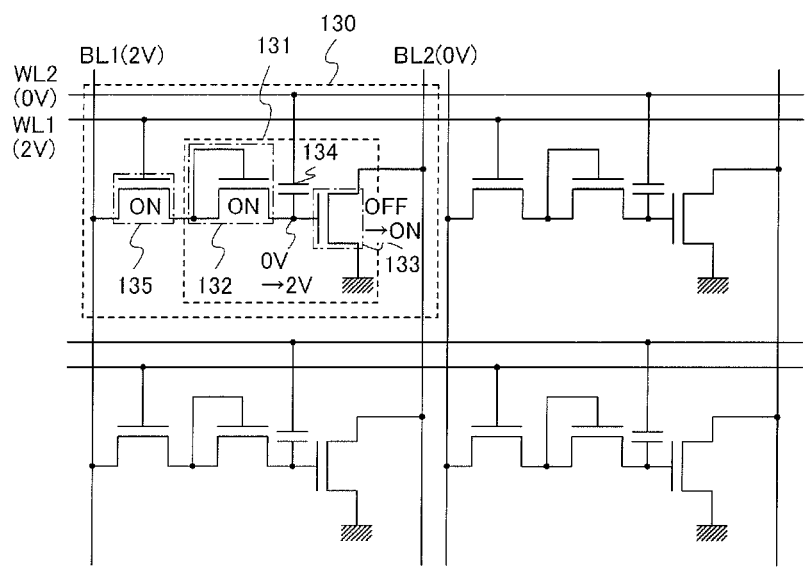
FIG. 6 is an equivalent circuit illustrating a semiconductor memory device according to one embodiment of the present invention.

First, writing of data in the NOR memory cell 130 illustrated in FIG. 2B will be described with reference to FIG. 6.

First, the first potential is applied to the bit line BL1 for writing and the word line WL1 for writing which belong to the memory cell 130 in which data is written, and the word line WL2 for reading is set at a ground potential. The first potential is a potential at which the transistors 133 and 135 are turned on. The first potential is a potential higher than the threshold voltage of each of the transistors 133 and 135, and is 2 V here.

When the potential of the word line WL1 for writing and the bit line BL1 for writing is the first potential, the transistor 135 and the diode-connected transistor 132 are turned on, so that electric charge is charged in the node A, that is, the capacitor 134 and the gate of the transistor 133, and the potential increases to approximately the same as the potential of the bit line BL1 for writing; accordingly, the transistor 133 is turned on. Through the above steps, data 1 can be written.

After the writing of data is finished, the potential of the bit line BL1 for writing and the potential of the word line WL1 for writing are 0 V. Accordingly, although the transistor 135 functioning as a selection transistor for writing and the diode-connected transistor 132 are off, the off-state current of the transistor 132 which is formed using an oxide semiconductor is very low; therefore, the voltage of the node A is held for a long period of time. Consequently, the memory element 131 functions as a write-once memory.

Figure 7A:
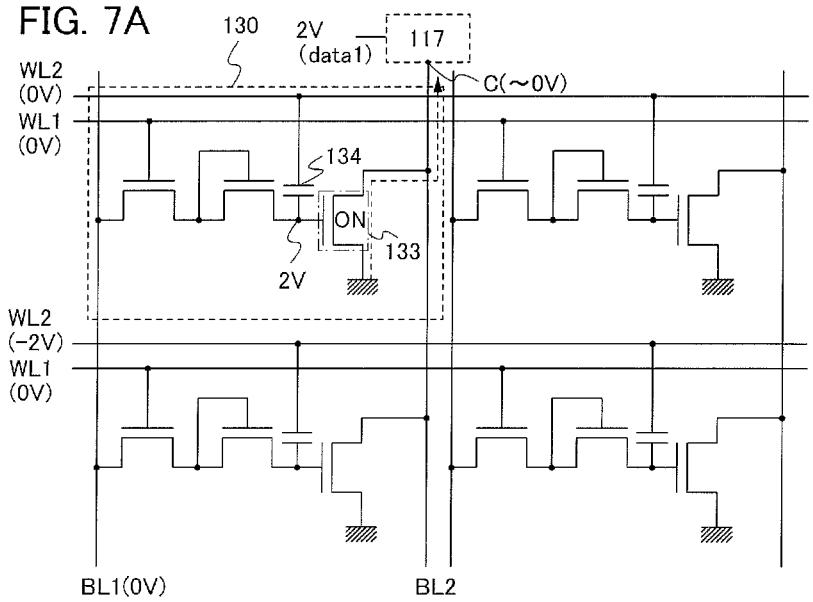
FIGS. 7A and 7B are equivalent circuits each illustrating a semiconductor memory device according to one embodiment of the present invention.
Figure 7B:
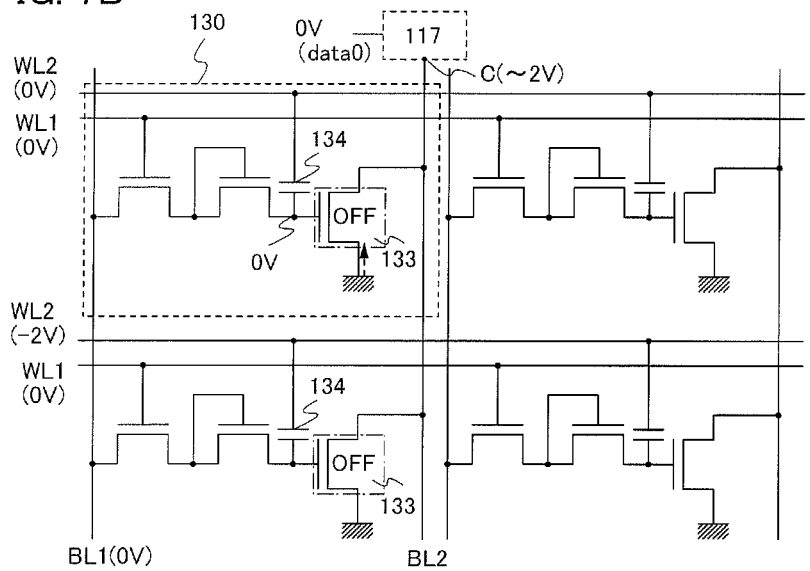

Next, reading of data in the memory cell 130 illustrated in FIG. 2B will be described with reference to FIGS. 7A and 7B. FIG. 7A illustrates a method for reading data 1, and FIG. 7B illustrates a method for reading data 0. In reading of data, the potential of the word line WL2 for reading is changed, and data is read in accordance with the voltage of the bit line BL2 for reading.

In the case of reading data 1, the word line WL2 for reading which belongs to a column through which data is read is set at a ground potential, and the other word lines WL2 for reading are set at the third potential which is a negative potential as illustrated in FIG. 7A.

When data 1 is stored in the memory cell 130 in which data is read, that is, the first voltage is charged in the capacitor 134 of the memory cell 130, the transistor 133 is turned on, and the potential of the node C of the bit line BL2 for reading is approximately 0 V. The potential of the node C is inverted by the inverter included in the readout circuit 117 to be output as data 1.

In the case of reading data 0, the word line WL2 for reading which belongs to a column through which data is read is set at a ground potential, and the other word lines WL2 for reading are set at the third potential which is a negative potential as illustrated in FIG. 7B.

When data 0 is stored in the memory cell 130 in which data is read, that is, electric charge is not charged in the capacitor 134 of the memory cell 130, the transistor 133 is turned off, and the potential of the node C of the bit line BL2 for reading is set to approximately 2 V by the readout circuit 117. The potential is inverted by the inverter included in the readout circuit 117 to be output as data 0.

Note that the third potential which is a negative potential is applied to the word lines WL2 for reading in the memory cells which belong to the columns through which data is not read. The potential of the capacitor 134 of the memory cell is a value in which the third potential is added to the potential stored in the node A. Because the third potential is a negative potential, the potential of the capacitor 134 of the memory cell decreases, and the transistor 133 is turned off regardless of data written to the memory cell. Therefore, there is no possibility of reading data in the memory cell which is not selected for reading.

Next, writing and reading of data in the NAND memory cell 120 illustrated in FIG. 3 according to Embodiment 1 will be described with reference to drawings.

Figure 8:
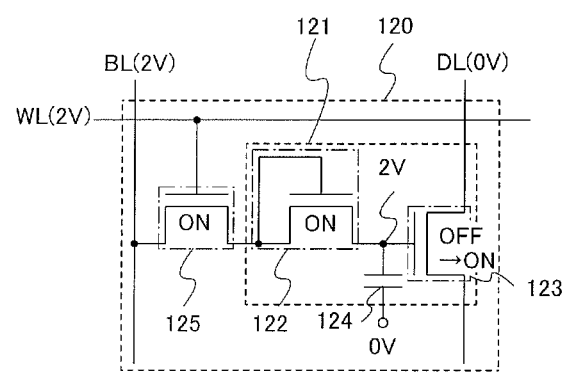
FIG. 8 is an equivalent circuit illustrating a semiconductor memory device according to one embodiment of the present invention.

The writing of data in the NAND memory cell 120 illustrated in FIG. 3 will be described with reference to FIG. 8.

First, the first potential is applied to the bit line BL and the word line WL which belong to the memory cell 120 in which data is written. The first potential is a potential at which the transistors 123 and 125 are turned on. The second electrode of the capacitor 124, which is not connected to the transistors 123 and 125, is a ground potential.

When the potential of the word line WL for writing is the first potential, the transistor 125 and the diode-connected transistor 122 are turned on, so that the potential of the node A, that is, the potential of the capacitor 124 and the gate of the transistor 123, increases to approximately the same as the potential of the bit line BL for writing; accordingly, the transistor 123 is turned on. Through the above steps, data 1 can be written.

After the writing of data is finished, the potential of the bit line BL for writing is 0 V. Accordingly, although the transistor 125 functioning as a selection transistor for writing and the diode-connected transistor 122 are off, the off-state current of the transistor 122 which is formed using an oxide semiconductor is very low; therefore, the potential of the node A is held for a long period of time. Consequently, the memory element 121 functions as a write-once memory.

Figure 9A:
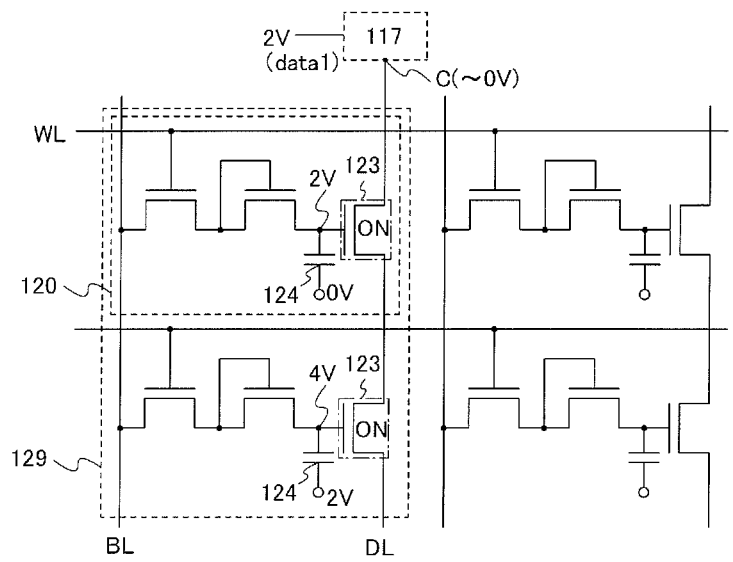
FIGS. 9A and 9B are equivalent circuits each illustrating a semiconductor memory device according to one embodiment of the present invention.
Figure 9B:
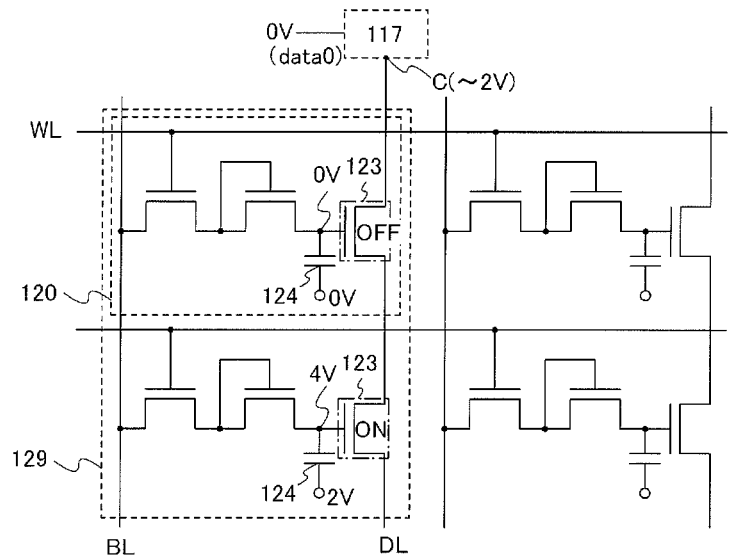

Next, reading of data in the memory cell 120 illustrated in FIG. 3 will be described with reference to FIGS. 9A and 9B. FIG. 9A illustrates a method for reading data 1, and FIG. 9B illustrates a method for reading data 0. Reading of data is performed in such a manner that voltages are applied to all the second electrodes of the capacitor 124, which are electrodes not connected to the transistor 123 in all the memory cells connected to a given bit line, that is, in the capacitors 124 included in the memory cells 120 which are included in a region 129. A ground potential is applied to the second electrode of the capacitor 124 of the memory cell which belongs to a line and in which data is read, and a fourth potential is applied to the second electrode of the capacitor 124 of the other of the memory cells included in the region 129, and an output from the readout circuit 117 is determined in accordance with the voltage of the bit line BL for reading. The fourth potential is a potential which is higher than the threshold voltage of the transistor 123, and the fourth potential is 2 V here.

In the case of reading data 1, electric charge is stored in the capacitor 124 of the memory cell in which data is read and the first potential is applied to the first electrode of the capacitor 124 as illustrated in FIG. 9A. Therefore, when the second electrode of the capacitor 124 is a ground potential, the transistor 123 is turned on. In contrast, when the fourth potential is applied to the second electrode of the capacitor 124 of the memory cell in which data is not read and which is in the region 129, the potential of the first electrode of the capacitor 124 increases, whereby the transistor 123 is turned on. As a result, all the transistors 123 connected to the data line DL are on, and the potential of the node C of the data line DL is 0 V. The potential of the node C is inverted by the inverter included in the readout circuit 117 to be output as data 1.

In the case of reading data 0, the first electrode of the capacitor 124 of the memory cell 120 in which data is read is 0 V as illustrated in FIG. 9B. Therefore, the transistor 123 of the memory cell in which data is read is off. On the other hand, when the fourth potential is applied to the second electrode of the capacitors 124 of the memory cells in which data is not read in the region 129, the potential of the first electrode of the capacitor 124 increases, whereby the transistor 123 is turned on. As a result, the potential of the node C of the data line DL is set to approximately 2 V by the readout circuit 117.

According to this embodiment, a semiconductor memory device in which high voltage is not needed in writing, a defect is less likely to occur, the writing time is short, and data cannot be rewritten can be provided.

(Embodiment 3)

In this embodiment, one embodiment of the semiconductor memory device described in Embodiments 1 and 2 will be described with reference to drawings.

Figure 10A:
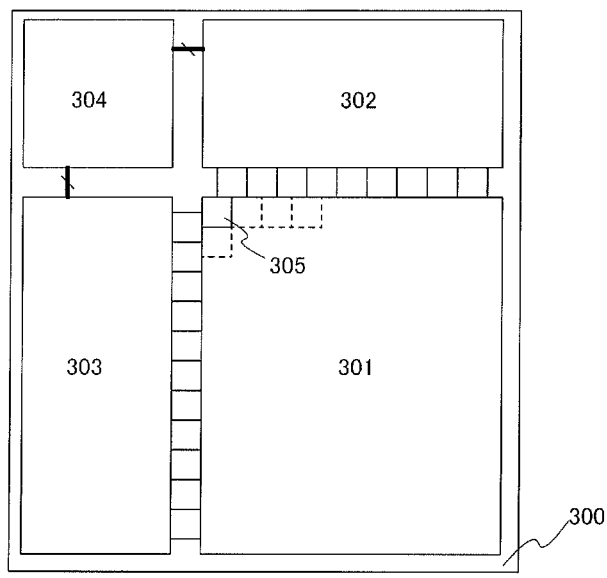
FIGS. 10A and 10B are block diagrams each illustrating a semiconductor memory device according to one embodiment of the present invention.

FIG. 10A is an example of a semiconductor memory device including the memory cell array described in Embodiment 1. A semiconductor memory device 300 includes a memory cell array 301, a column decoder 302, a row decoder 303, and an interface circuit 304. The memory cell array 301 includes a plurality of memory cells 305 arranged in matrix.

The interface circuit 304 generates signals for driving the column decoder 302 and the row decoder 303 from external signals and outputs data which is read from the memory cell 305 to the outside.

The column decoder 302 receives a signal for driving the memory cell 305 from the interface circuit 304 and generates a signal for writing or reading which is to be transmitted to a bit line. The row decoder 303 receives a signal for driving the memory cell 305 from the interface circuit 304 and generates a signal for writing or reading which is to be transmitted to a word line. With the signal which is to be output to the bit line from the column decoder 302 and the signal which is to be output to the word line from the row decoder 303, the memory cell which performs access in the memory cell array 301 is uniquely determined.

Figure 10B:
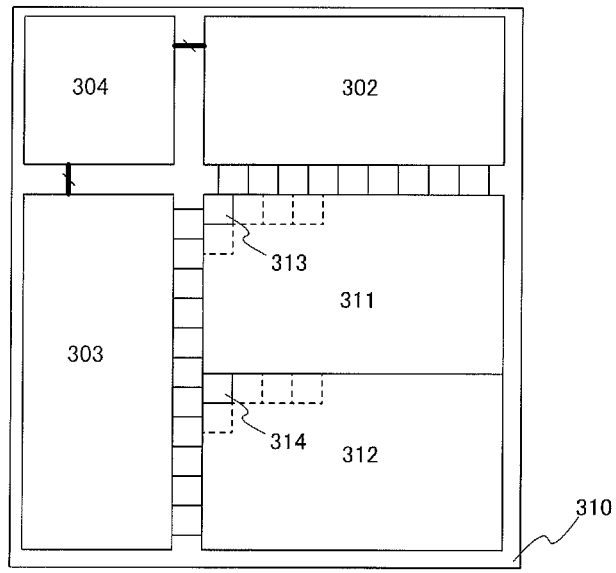

Further, as illustrated in FIG. 10B, it is possible to form a semiconductor memory device including a memory cell array in which the write-once memory described in Embodiment 1 and Embodiment 2 and a rewritable memory are combined. A semiconductor memory device 310 illustrated in FIG. 10B includes a first memory cell array 311, a second memory cell array 312, the column decoder 302, the row decoder 303, and the interface circuit 304. In the first memory cell array 311, memory cells 313 each having the write-once memory described in Embodiment 1 and Embodiment 2 are arranged in matrix. In the second memory cell array 312, memory cells 314 each having a rewritable memory element are arranged in matrix.

The rewritable memory element can be formed by the same process as that of the write-once memory described in Embodiment 1 and Embodiment 2. The structure of the rewritable memory element is described with reference to FIG. 11A and FIG. 11B.

Figure 11A:
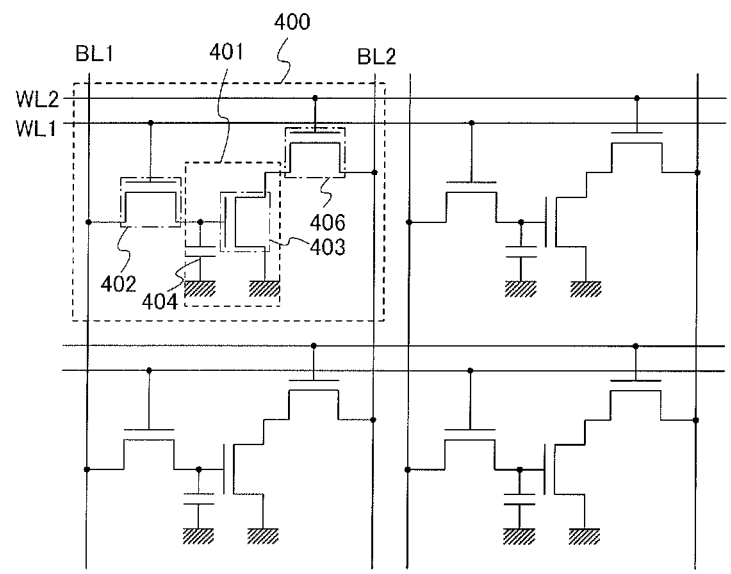
FIGS. 11A and 11B are equivalent circuits each illustrating a semiconductor memory device according to one embodiment of the present invention.

FIG. 11A is a diagram illustrating a memory cell having a rewritable memory element of NOR type and a memory cell array. A memory cell 400 includes a memory element 401; a transistor 402 whose gate is connected to the word line WL1 for writing, whose first electrode is connected to the memory element 401, and whose second electrode is connected to the bit line BL1 for writing; and a transistor 406 whose gate is connected to the word line WL2 for reading, whose first electrode is connected to the bit line BL2 for reading, and whose second electrode is connected to the memory element 401. The transistor 406 functions as a selection transistor for reading.

The memory element 401 includes a transistor 403 and a capacitor 404. A gate of the transistor 403 is connected to a first electrode of the capacitor 404 and the first electrode of the transistor 402. In addition, a first electrode of the transistor 403 is connected to the second electrode of the transistor 406, and a second electrode of the transistor 403 has a fixed potential. A second electrode of the capacitor 404 also has a fixed potential.

The transistor 402 is formed using an oxide semiconductor in a manner similar to that of the transistor 102 described in Embodiment 1. The transistors 403 and 406 can be formed in a manner similar to that of the transistor 103 described in Embodiment 1.

Figure 12A:
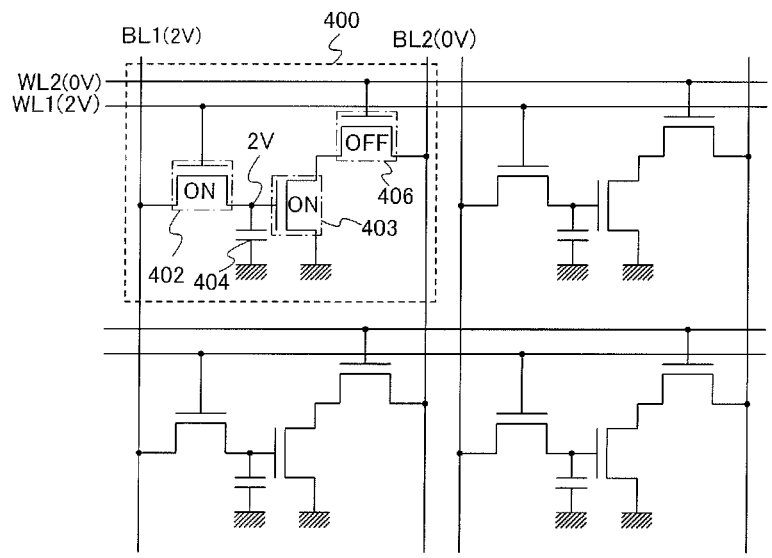
FIGS. 12A and 12B are equivalent circuits each illustrating a semiconductor memory device according to one embodiment of the present invention.

The writing of data in the NOR memory cell 400 illustrated in FIG. 11A is described with reference to FIGS. 12A and 12B. FIG. 12A illustrates a method for writing data 1, and FIG. 12B illustrates a method for writing data 0.

In the case of writing of data 1 as illustrated in FIG. 12A, the first potential is applied to the bit line BL1 for writing and the word line WL1 for writing which are connected to the memory cell 400 in which data is written, and the word line WL2 for reading has a ground potential. The first potential is a potential at which the transistors 402 and 403 are turned on and which is higher than the threshold voltage of each of the transistors 402 and 403, and is 2 V here.

When the potential of the word line WL1 for writing is the first potential, the transistor 402 is turned on, and the potential of the node A, that is, the potential of the capacitor 404 and the gate of the transistor 403 increases to a potential which is approximately the same as the potential of the bit line BL1 for writing, whereby the transistor 403 is turned on. By the above steps, data 1 can be written.

Figure 12B:
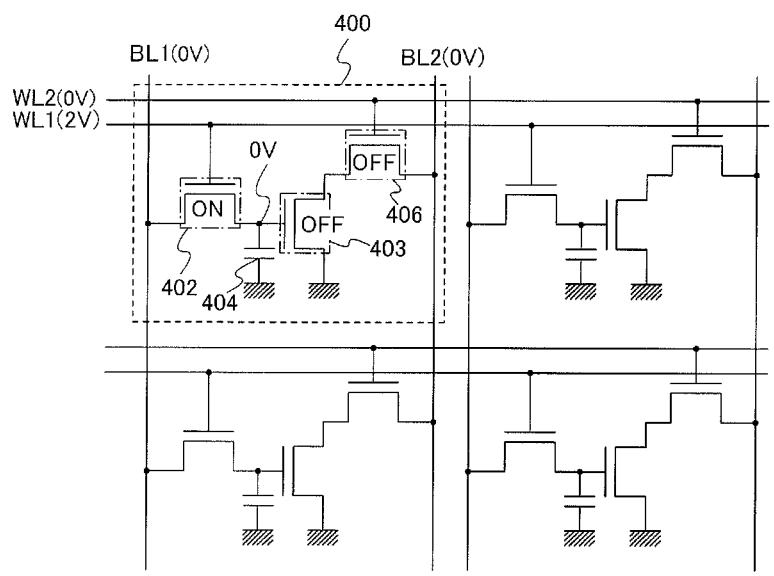

In the case of writing of data 0 as illustrated in FIG. 12B, the bit line BL1 for writing which is connected to the memory cell 400 in which data is written has a ground potential, the first potential is applied to the word line WL1 for writing, and the word line WL2 for reading has a ground potential. The first potential is a potential at which the transistor 402 is turned on and which is higher than the threshold voltage of the transistor 402, and is 2 V here.

When the potential of the word line WL1 for writing is the first potential, the transistor 402 is turned on, and the potential of the node A, that is, the potential of the capacitor 404 and the potential of the gate of the transistor 403 decreases to a potential of the bit line BL1 for writing which is a ground potential. Thus, the transistor 403 is turned off, and data 0 can be written. Note that to prevent unintended reading of data, the word line WL2 for reading is made to have a ground potential and the transistor 406 is turned off in a writing period.

Figure 13A:
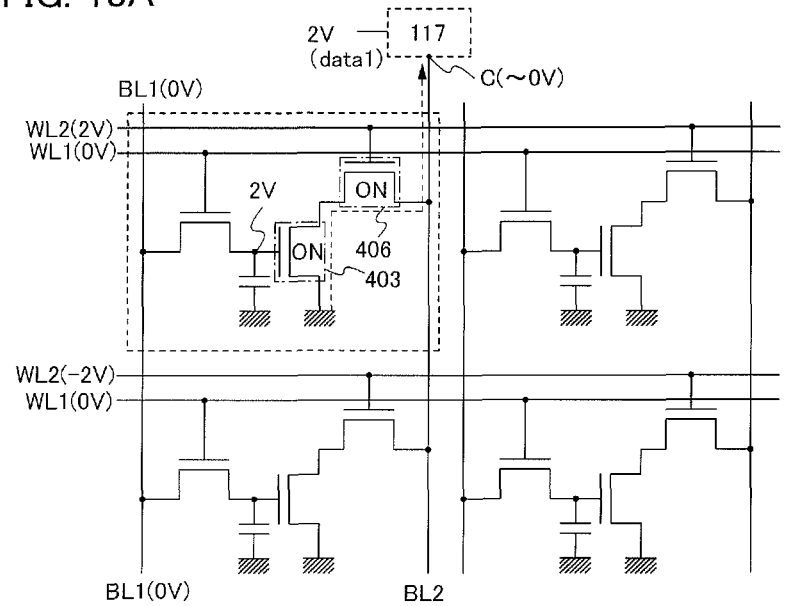
FIGS. 13A and 13B are equivalent circuits each illustrating a semiconductor memory device according to one embodiment of the present invention.
Figure 13B:
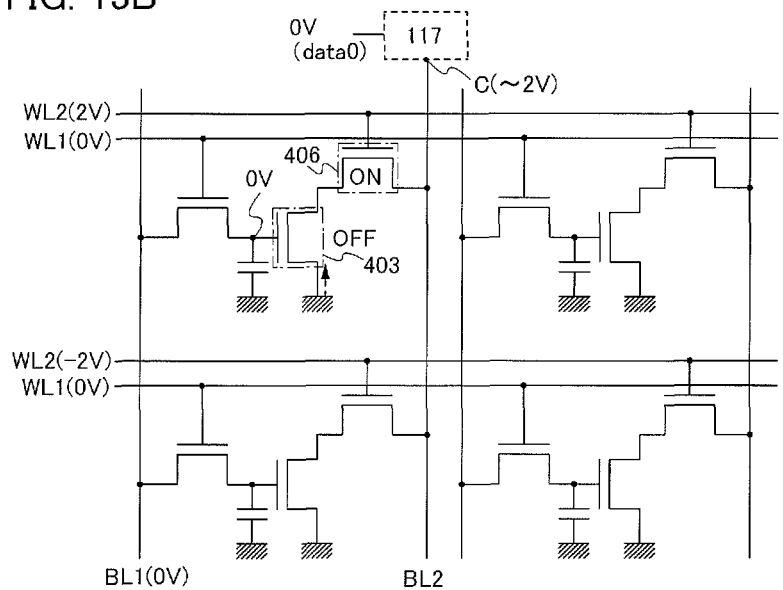

Next, reading of data in the memory cell 400 illustrated in FIG. 11A is described with reference to FIGS. 13A and 13B. FIG. 13A illustrates a method for reading data 1, and FIG. 13B illustrates a method for reading data 0. In reading of data, the potential of the word line WL2 for reading is changed, the transistor 406 functioning as a selection transistor for reading is turned on, and an output from the readout circuit 117 is determined in accordance with the voltage of the bit line BL2 for reading.

In the case of reading data 1 as illustrated in FIG. 13A, the second potential is applied to the word line WL2 for reading which belongs to a line through which data is read, and the transistor 406 is turned on. In the case of data 1, the transistor 403 is on; therefore, the node C of the bit line BL2 for reading has a ground potential in a manner similar to that of the reading method of the write-once memory element of NOR type illustrated in FIG. 2A according to Embodiment 2. The potential of the node C is inverted by the lovelier included in the readout circuit 117 and is output as data 1.

In the case of reading data 0 as illustrated in FIG. 13B, the second potential is applied to the word line WL2 for reading, and the transistor 406 is turned on. In the case of data 0, the transistor 403 is off; therefore, the bit line BL2 for reading is set to approximately 2 V by the readout circuit 117. The potential is inverted by the inverter included in the readout circuit 117 and is output as data 0.

Note that in memory cells in which data is not read of columns, the third potential which is a negative potential is applied to the word line WL2 for reading. The third potential is a potential at which the transistor 406 is turned off and a negative potential that is lower than the threshold voltage of the transistor 406, and is −2 V here. The transistor 406 is turned off. Therefore, there is no possibility of reading data in the memory cell in which reading of data is not selected.

Figure 11B:
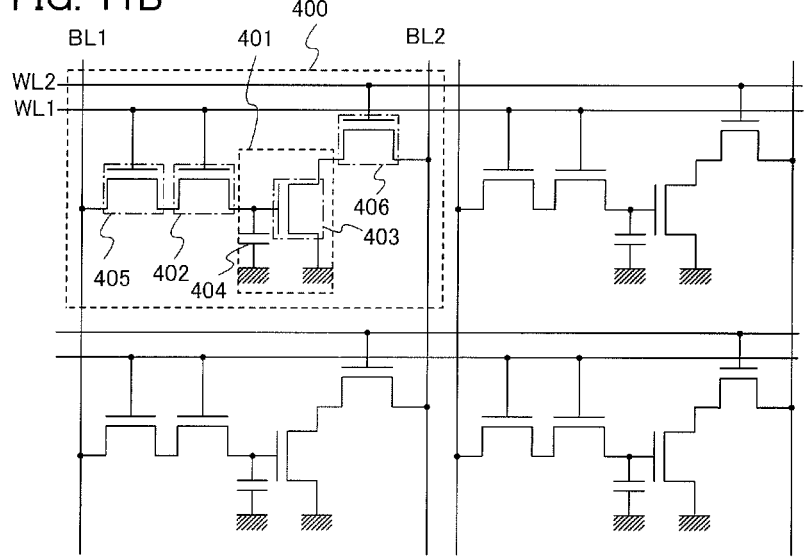

FIG. 11B is a diagram illustrating a memory cell including a rewritable memory element of NOR type which is different from the memory cell in FIG. 11A. The memory cell illustrated in FIG. 11B has a structure including a transistor 405 between the transistor 402 and the bit line BL1 for writing which are illustrated in FIG. 11A. In this structure, a connection of the gate of the transistor 112 described in Embodiment 1 is changed, and the gate is merely connected to the word line WL1 for writing. In other words, with a slight variation in wirings, the write-once memory can be replaced with the rewritable memory or the rewritable memory can be replaced with the write-once memory. Since a method for writing data and a method for reading data are in common with FIG. 11A, these are omitted.

Note that in this embodiment, the write-once memory and the rewritable memory element are of NOR type; however, a NAND type can be used as appropriate.

In this manner, the write-once memory and the rewritable memory can be provided on the same semiconductor memory device. The rewritable memory can be formed by the same process as that of the write-once memory described in Embodiment 1 and Embodiment 2, and the write-once memory can be used as a write-once memory and the rewritable memory can be used as a rewritable memory without depending on the operation by a logic signal. Therefore, it is possible to provide a semiconductor memory device in which rewriting of data due to malfunction of a logic circuit does not occur in principle.

(Embodiment 4)

In this embodiment, a structure of the semiconductor memory device described in Embodiments 1 to 3 and a manufacturing method thereof are described with reference to FIG. 14, FIG. 15, and FIGS. 16A to 16E.

In this embodiment, the structure of the semiconductor memory device described in Embodiment 1 is described using a top view and a cross-sectional view, and the structure can be applied to Embodiment 2 and Embodiment 3, as appropriate.

Figure 14:
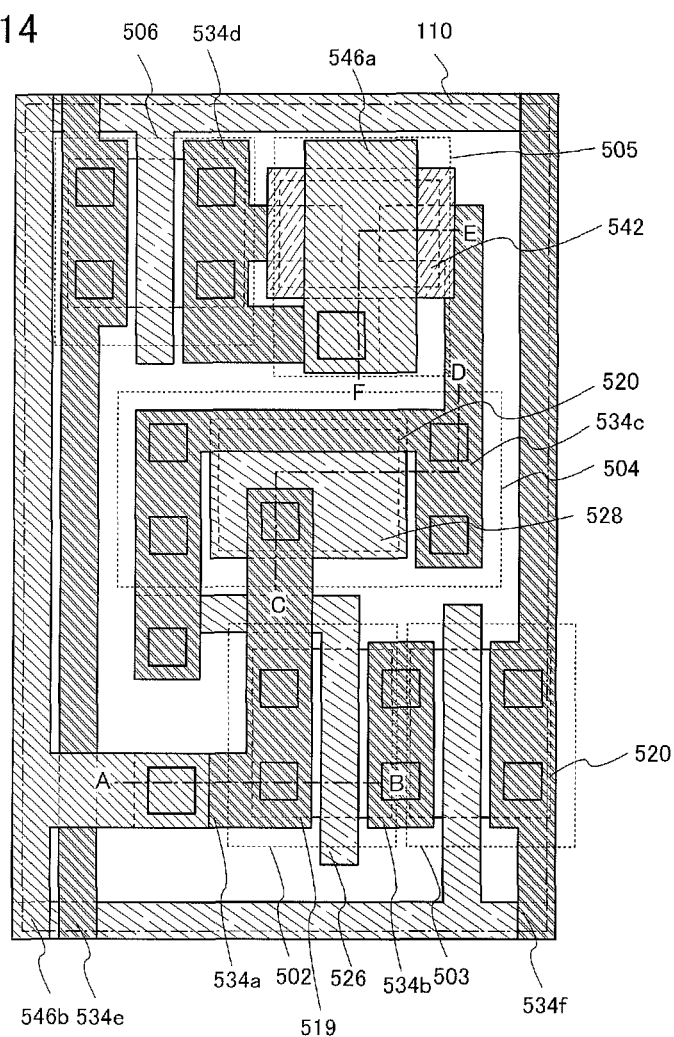
FIG. 14 is a top view illustrating a semiconductor memory device according to one embodiment of the present invention.
Figure 15:
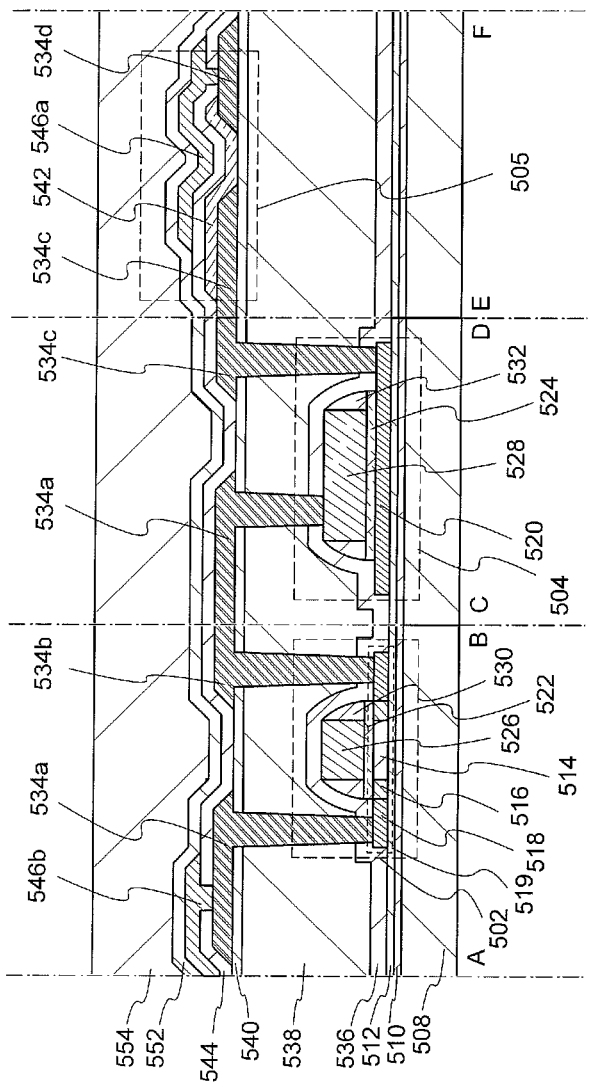
FIG. 15 is a cross-sectional view illustrating a semiconductor memory device according to one embodiment of the present invention.

FIG. 14 is one embodiment of a top view of the memory cell 110 in the semiconductor memory device described in Embodiment 1, and a cross-sectional view taken along lines A-B, C-D, and E-F of FIG. 14 is illustrated in FIG. 15.

A transistor 502 illustrated in FIG. 14 corresponds to the transistor 113 illustrated in FIG. 2A, a transistor 503 corresponds to the transistor 116 illustrated in FIG. 2A, a diode-connected transistor 505 corresponds to the diode-connected transistor 112 illustrated in FIG. 2A, and a transistor 506 corresponds to the transistor 115 illustrated in FIG. 2A. In addition, a capacitor 504 corresponds to the capacitor 114 illustrated in FIG. 2A.

Although all the transistors are n-channel transistors here, it is needless to say that p-channel transistors can be used. Further, the technical nature of the present invention disclosed herein is to form a channel region of the diode-connected transistor 505 using an oxide semiconductor layer; therefore, a specific structure of a semiconductor memory device is not necessarily limited to the structure described herein.

As illustrated in FIG. 15, the transistor 502 and the capacitor 504 are provided over an insulating layer 510 and an insulating layer 512 which are stacked over a substrate 508; the transistor 505 is provided over the insulating layer 510, the insulating layer 512, an insulating layer 536, an insulating layer 538, and an insulating layer 540 which are stacked.

The semiconductor memory device described in this embodiment includes the transistor 502, the transistor 503 (not illustrated), the capacitor 504, and the transistor 506 (not illustrated) in the lower part, and the diode-connected transistor 505 in the upper part. Note that the capacitor 504 may be provided in the upper part instead of in the lower part but.

The transistor 502 includes a semiconductor layer 519 formed over the insulating layer 512, a gate insulating layer 522 provided over the semiconductor layer 519, a gate electrode 526 provided over the gate insulating layer 522, and wirings 534a and 534b which are electrically connected to the semiconductor layer 519. The semiconductor layer 519 is formed with a channel region 514, and low-concentration impurity regions 516 and high-concentration impurity regions 518 (these are also collectively referred to simply as impurity regions) which are provided so as to sandwich the channel region 514.

Here, a sidewall insulating layer 530 is provided on a side surface of the gate electrode 526. Further, the sidewall insulating layer 530 overlaps with the low-concentration impurity regions 516.

The capacitor 504 includes a semiconductor layer 520 which is formed over the insulating layer 512 and with a high-concentration impurity region, a gate insulating layer 524 provided over the semiconductor layer 520, a capacitor electrode 528 provided over the gate insulating layer 524, a wiring 534c electrically connected to the semiconductor layer 520, and the wiring 534b connected to the capacitor electrode 528. Here, a sidewall insulating layer 532 is provided on a side surface of the capacitor electrode 528.

The insulating layer 536, the insulating layer 538, and the insulating layer 540 are provided so as to cover the transistor 502 and the capacitor 504.

The diode-connected transistor 505 includes an oxide semiconductor layer 542 electrically connected to the wiring 534c and a wiring 534d which are provided over the insulating layer 540; a gate insulating layer 544 covering the wiring 534c, the wiring 534d, and the oxide semiconductor layer 542; and a gate electrode 546a which is provided over the gate insulating layer 544 and which overlaps with the oxide semiconductor layer 542. Further, the gate electrode 546a seals an opening formed in the gate insulating layer 544, and the gate electrode 546a is electrically connected to the wiring 534d to be diode-connected.

An insulating layer 552 and an insulating layer 554 are provided so as to cover the transistor 505.

Further, as illustrated in FIG. 14, a wiring 546b functioning as a ground wiring and the wiring 546b is electrically connected to the wiring 534a of the transistor 502 through an opening formed in the gate insulating layer 544. The capacitor electrode 528 is electrically connected to the wiring 534a; therefore, the capacitor electrode 528 of the capacitor 504 is electrically connected to the wiring 5466.

The wiring 534a is electrically connected to the high-concentration impurity region 518 and the capacitor electrode 528 of the capacitor 504 through openings formed in the insulating layer 536, the insulating layer 538, and the insulating layer 540. The wiring 534b is electrically connected to the high-concentration impurity region 518 through an opening formed in the insulating layer 536, the insulating layer 538, and the insulating layer 540. The wiring 534c is electrically connected to the semiconductor layer 520 which is a high-concentration impurity semiconductor and the gate electrode 526 (see FIG. 14) of the transistor 502 through openings formed in the insulating layer 536, the insulating layer 538, and the insulating layer 540.

In addition, as illustrated in FIG. 14, the wiring 534d is electrically connected to a high-concentration impurity region of the transistor 506 through an opening formed in the insulating layer 536, the insulating layer 538, and the insulating layer 540, and is electrically connected to the oxide semiconductor layer 542 of the transistor 505. A wiring 534e is electrically connected to the high-concentration impurity region of the transistor 506 through an opening formed in the insulating layer 536, the insulating layer 538, and the insulating layer 540. A wiring 534f is electrically connected to a high-concentration impurity region of the transistor 503 through an opening formed in the insulating layer 536, the insulating layer 538, and the insulating layer 540.

It is necessary that the substrate 508 have at least heat resistance high enough to withstand heat treatment performed later. When a glass substrate is used as the substrate 508, a glass substrate whose strain point is higher than or equal to 730° C. is preferably used. As the glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used.

Instead of the glass substrate, a substrate formed of an insulator, such as a ceramic substrate, a quartz substrate, or a sapphire substrate can be used. Alternatively, crystallized glass or the like may be used. Further alternatively, a semiconductor substrate, such as a silicon wafer, whose surface is provided with an insulating layer, or a conductive substrate formed of a metal material, whose surface is provided with an insulating layer can be used. Further alternatively, a plastic substrate can be used. Note that in the case where a plastic substrate is used for the substrate 508, an adhesive agent may be provided between the substrate 508 and the insulating layer 510.

The insulating layer 510 is preferably formed using a nitride insulating layer, and the insulating layer 512 is preferably formed using an oxide insulating layer. As the nitride insulating layer, there are a silicon nitride layer; a silicon nitride oxide layer, an aluminum nitride layer, and the like. As the oxide insulating layer, there are a silicon oxide layer, a silicon oxynitride layer, an aluminum oxide layer, and the like.

The semiconductor layer 519 of the transistor 502 and the semiconductor layer 520 of the capacitor 504, which is a high-concentration impurity semiconductor, can be formed using an amorphous silicon layer, a microcrystalline silicon layer, a polycrystalline silicon layer, or a single crystal silicon layer. Note that as a transistor in which a single crystal silicon layer is used for a channel region, in addition to a transistor in which a single crystal semiconductor substrate is used for a channel region, a transistor formed using a so-called silicon-on-insulator (SOI) substrate in which a single crystal silicon layer used for a channel region is formed on an insulating region can be employed. Alternatively, the semiconductor layer 519 of the transistor 502 may be formed using an oxide semiconductor layer which is similar to an oxide semiconductor layer in the diode-connected transistor 505 to be described.

The gate insulating layer 522 and the gate insulating layer 524 can be formed in a single layer or a stacked layer using a silicon oxide layer, a silicon nitride layer, a silicon oxynitride layer, a silicon nitride oxide layer, or an aluminum oxide layer.

Alternatively, the gate insulating layer 522 and the gate insulating layer 524 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby gate leakage current can be reduced. Further alternatively, a stacked structure in which a high-k material and one or more of a silicon oxide layer, a silicon nitride layer, a silicon oxynitride layer, a silicon nitride oxide layer, and an aluminum oxide layer are stacked can be used. The thickness of each of the gate insulating layer 522 and the gate insulating layer 524 can be greater than or equal to 10 nm and less than or equal to 300 nm.

The gate electrode 526 and the capacitor electrode 528 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. Further, each of the gate electrode 526 and the capacitor electrode 528 may have a single-layer structure or a stacked structure of two or more layers. For example, there are a single-layer structure of an aluminum layer containing silicon; a two-layer structure in which a titanium layer is stacked over an aluminum layer; a two-layer structure in which a titanium layer is stacked over a titanium nitride layer; a two-layer structure in which a tungsten layer is stacked over a titanium nitride layer; a two-layer structure in which a tungsten layer is stacked over a tantalum nitride layer; and a three-layer structure in which a titanium layer, an aluminum layer, and a titanium layer are stacked in that order. Alternatively, a layer, an alloy layer, or a nitride layer which contains aluminum and one or more elements selected from titanium, tantalum, tungsten, molybdenum, chromium, neodymium, and scandium may be used.

Alternatively, the gate electrode 526 and the capacitor electrode 528 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode 526 and the capacitor electrode 528 can have a stacked structure having a layer containing the above light-transmitting conductive material and a layer containing the above metal element.

The sidewall insulating layer 530 and the sidewall insulating layer 532 can be formed using a material similar to that of the gate insulating layer 522 and the gate insulating layer 524. Note that a sidewall insulating layer is not formed in some cases for integration of the transistor and the capacitor.

The insulating layer 536 and the insulating layer 540 can be formed in a manner similar to that of the gate insulating layer 522 and the gate insulating layer 524. The insulating layer 538 can be formed using an organic resin layer. Examples of the organic resin layer include acrylic, epoxy, polyimide, polyamide, polyvinylphenol, and benzocyclobutene. Alternatively, a siloxane polymer can be used.

The wirings 534a to 534f can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. Further, each of the wirings 534a to 534f may have a single-layer structure or a stacked structure of two or more layers. For example, there are a single-layer structure of an aluminum layer containing silicon; a two-layer structure in which a titanium layer is stacked over an aluminum layer; a two-layer structure in which a titanium layer is stacked over a titanium nitride layer; a two-layer structure in which a tungsten layer is stacked over a titanium nitride layer; a two-layer structure in which a tungsten layer is stacked over a tantalum nitride layer; and a three-layer structure in which a titanium layer, an aluminum layer, and a titanium layer are stacked in that order. Alternatively, a layer, an alloy layer, or a nitride layer which contains aluminum and one or more elements selected from titanium, tantalum, tungsten, molybdenum, chromium, neodymium, and scandium may be used.

Alternatively, the wirings 534a to 534f can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked structure having a layer containing the above light-transmitting conductive material and a layer containing the above metal element.

Note that the transistor 505 and the transistor 506 can each have a structure which is similar to the structure of the transistor 502.

As the oxide semiconductor layer 542, an oxide semiconductor layer using any of the followings can be used: a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide. Here, an n-component metal oxide includes an oxide of n kinds of metals. Note that the oxide semiconductor may contain, as an impurity, an element other than the metal oxide that is the main component at less than or equal to 1%, preferably at less than or equal to 0.1%.

Further, the oxide semiconductor layer 542 may be formed using a three-component metal oxide, and a metal oxide represented by $InM_XZn_YO_Z$ (Y=0.5 to 5) may be used. Here, M represents one or more elements selected from the elements of Group 13 such as gallium (Ga), aluminum (Al), and boron (B). Note that the contents of In, M, Zn, and O can be set freely, and the case where the M content is zero (that is, X=0) is included. On the other hand, the contents of In and Zn are not zero. In other words, the above-described expression includes In—Ga—Zn—O-based metal oxide, In—Zn—O-based metal oxide, and the like.

In addition, the energy gap of the metal oxide which forms the oxide semiconductor layer 542 is 2 eV or more, preferably 2.5 eV or more, more preferably 3 eV or more.

For the oxide semiconductor layer 542, an oxide semiconductor with an amorphous structure, a microcrystalline structure, a polycrystalline structure, or a single crystal structure can be used as appropriate. In addition, an oxide semiconductor having a crystal in which the c-axis is approximately parallel to a direction which is perpendicular to a surface of the oxide semiconductor can be used.

The oxide semiconductor layer 542 is formed using an i-type or substantially i-type oxide semiconductor layer. The carrier density of the i-type or substantially i-type oxide semiconductor layer is less than $5 \times 10^{14}/cm^3$, preferably less than $1 \times 10^{12}/cm^3$, more preferably less than or equal to $1 \times 10^{11}/cm^3$. In addition, it is preferable that hydrogen or oxygen deficiency serving as a donor be little and the hydrogen concentration be less than or equal to $1 \times 10^{16}/cm^3$. Note that the carrier density can be obtained by the Hall effect measurement. Lower carrier density can be obtained from the measurement results of capacitance-voltage (CV) measurement. The hydrogen concentration in the oxide semiconductor layer can be measured by secondary ion mass spectrometry (SIMS).

The i-type or substantially i-type oxide semiconductor layer 542 is used for a channel region of the transistor 505, and the off-state current of the transistor 505 can be less than or equal to $1 \times 10^{-19}$ A/μm, further less than or equal to $1 \times 10^{-20}$ A/μm. The i-type or substantially i-type oxide semiconductor layer has a wide band gap and requires a large amount of thermal energy for electronic excitation; therefore, direct recombination and indirect recombination are less likely to occur. Therefore, the number of holes which are minority carriers is substantially zero in a state where a negative potential is applied to a gate electrode (i.e., in an off state); accordingly, direct recombination and indirect recombination are less likely to occur, and the amount of current is very small. As a result, a circuit can be designed with the oxide semiconductor layer that can be considered as an insulator in a state where the transistor is in a non-conducting state (also referred to as an OFF state). On the other hand, when the transistor is in a conducting state, the current supply capability of the i-type or substantially i-type oxide semiconductor layer is expected to be higher than the current supply capability of a semiconductor layer formed of amorphous silicon. Therefore, the transistor 505 serves as a normally-off transistor with very low leakage current in an off state, and has excellent switching characteristics.

For the gate insulating layer 544, a material used for the gate insulating layer 522 and the gate insulating layer 524 can be used as appropriate. Note that in the case where the gate insulating layer 544 has a stacked structure, a layer on a side which is in contact with the oxide semiconductor layer 542 is formed using an oxide insulating layer, whereby oxygen can be supplied to the oxygen deficiency included in the oxide semiconductor layer 542, and the oxide semiconductor layer 542 can be made to be an i-type or substantially i-type oxide semiconductor layer.

The insulating layer 552 and the insulating layer 554 can be formed in a manner similar to that of the insulating layer 536, the insulating layer 538, or the insulating layer 540.

In this embodiment, a channel region of the diode-connected transistor 505 is formed using an i-type or substantially i-type oxide semiconductor layer; thus, off-state current can be extremely reduced. Therefore, voltage applied to the capacitor 504 can be held for a long time.

Next, a manufacturing process of the transistor 505 in the semiconductor memory device illustrated in FIG. 15 is described with reference to FIGS. 16A to 16E. Note that a known manufacturing process of a transistor may be employed as appropriate for each manufacturing process of the transistor 502, the transistor 503, and the transistor 506.

Figure 16A:
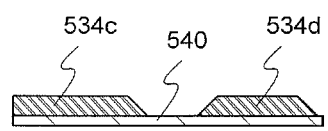
FIGS. 16A to 16E are cross-sectional views illustrating a method for manufacturing a semiconductor memory device according to one embodiment of the present invention.

As illustrated in FIG. 16A, the wiring 534c and the wiring 534d which function as a source electrode and a drain electrode of the transistor 505 are formed over the insulating layer 540.

The insulating layer 540 can be formed by a sputtering method, a CVD method, a printing method, a coating method, or the like. Alternatively, the dense high-quality insulating layer 540 having high withstand voltage can be formed by high-density plasma-enhanced CVD using microwaves (e.g., a frequency of 2.45 GHz). A close contact between an oxide semiconductor layer and the high-quality gate insulating layer 540 can reduce interface states and produce desirable interface characteristics. In addition, since the insulating layer 540 formed by the high-density plasma-enhanced CVD can have a uniform thickness, the insulating layer 540 has excellent step coverage. Further, the thickness of the insulating layer 540 formed using the high-density plasma-enhanced CVD can be controlled precisely. Note that the i-type or substantially i-type oxide semiconductor layer is extremely sensitive to an interface state or interface charge; therefore, formation of the insulating layer 540 by the high density plasma-enhanced CVD using microwaves can reduce interface states and produce desirable interface characteristics.

Note that the substrate 508 is heated when the insulating layer 540 is formed, whereby the amount of hydrogen, water, a hydroxyl group, hydride, or the like included in the insulating layer 540 can be reduced.

Further, in the case where the insulating layer 540 is formed by a sputtering method, the insulating layer 540 is preferably formed while hydrogen, water, a hydroxyl group, hydride, or the like remaining in a treatment chamber is removed in order to reduce the amount of hydrogen, water, a hydroxyl group, hydride, or the like included in the insulating layer 540. It is preferable to use an entrapment vacuum pump in order to remove hydrogen, water, a hydroxyl group, hydride, or the like remaining in the treatment chamber. Typical examples of entrapment vacuum pumps are a cryopump, an ion pump, and a titanium sublimation pump. Alternatively, a turbo pump provided with a cold trap can be used as the evacuation unit.

The purity of the sputtering gas used in forming the insulating layer 540 is preferably 6N (99.9999%) or higher, more preferably 7N (99.99999%) or higher (that is, the concentration of the impurities is 1 ppm or lower, preferably 0.1 ppm or lower), whereby the amount of hydrogen, water, a hydroxyl group, hydride, or the like included in the insulating layer 540 can be reduced.

The wiring 534c and the wiring 534d are formed using a printing method, an ink-jet method, or the like, whereby the number of steps can be reduced. Alternatively, after a conductive layer is formed over the insulating layer 540 by a sputtering method, a CVD method, an evaporation method, or the like, the conductive layer is etched using, as a mask, a resist formed in a photolithography process, whereby the wiring 534c and the wiring 534d can be formed.

Figure 16B:
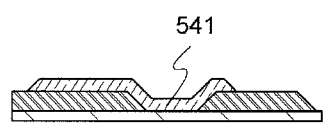

Next, as illustrated in FIG. 16B, an oxide semiconductor layer 541 is formed over the insulating layer 540, the wiring 534c, and the wiring 534d. The oxide semiconductor layer 541 can be formed by a printing method, an ink-jet method, or the like. Alternatively, an oxide semiconductor layer is formed over the insulating layer 540 by a sputtering method, a CVD method, a coating method, a pulsed laser evaporation method, or the like, and the oxide semiconductor layer is etched using, as a mask, a resist formed in a photolithography process, whereby the island-shaped oxide semiconductor layer 541 can be formed.

The carrier density of the oxide semiconductor layer depends on the hydrogen concentration in a source gas and a target under deposition conditions and the oxygen concentration therein, a material to be deposited and the composition thereof, heat treatment conditions, and the like. The hydrogen concentration in the oxide semiconductor layer is decreased or the oxygen concentration in the oxide semiconductor layer is increased to reduce oxygen deficiencies, whereby the oxide semiconductor layer is made to be an i-type or substantially i-type oxide semiconductor layer. In this embodiment, since treatment by which the oxide semiconductor layer is made to be i-type or substantially i-type is performed later, the oxide semiconductor layer 541 may be either an i-type oxide semiconductor layer or an n-type oxide semiconductor layer.

Note that in the case where the oxide semiconductor layer is formed by a sputtering method, the substrate is heated, whereby impurities such as hydrogen, water, a hydroxyl group, or hydride included in the oxide semiconductor layer can be reduced. Further, in the first heat treatment, crystal growth can be promoted.

In addition, in the case where the oxide semiconductor layer is formed by a sputtering method, the relative density of a metal oxide in the metal oxide target is set to greater than or equal to 80%, preferably greater than or equal to 95%, more preferably greater than or equal to 99.9%. Accordingly, the impurity concentration in the oxide semiconductor layer can be reduced, and a transistor which has excellent electrical characteristics or high reliability can be obtained.

Further, when preheat treatment is performed before the oxide semiconductor layer is formed, hydrogen, water, a hydroxyl group, hydride, or the like which remains on the inner wall of the sputtering apparatus, on a surface of a target, or inside a target material can be removed. Accordingly, impurities such as hydrogen, water, a hydroxyl group, or hydride included in the oxide semiconductor layer can be reduced.

In a manner similar to that of the insulating layer 540, before, during, or after the oxide semiconductor layer is formed, an entrapment vacuum pump is preferably used so as to remove hydrogen, water, a hydroxyl group, hydride, or the like remaining in the sputtering apparatus. Accordingly, hydrogen, water, a hydroxyl group, hydride, or the like is removed, whereby the concentration of hydrogen, water, a hydroxyl group, hydride, or the like included in the oxide semiconductor layer can be reduced.

Next, the first heat treatment is performed, and impurities such as hydrogen, water, a hydroxyl group, or hydride included in the oxide semiconductor layer 541 are removed. That is, at least one of dehydration and dehydrogenation can be performed. Note that in the first heat treatment, an oxygen deficiency is formed in the oxide semiconductor layer 541.

The temperature of the first heat treatment is higher than or equal to 400° C. and lower than or equal to 750° C., preferably higher than or equal to 400° C. and lower than the strain point of the substrate. The heat treatment apparatus for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used as the heat treatment apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

It is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is preferably 6N (99.9999%) or higher, more preferably 7N (99.99999%) or higher (that is, the concentration of the impurities is 1 ppm or lower, preferably 0.1 ppm or lower).

At the time of increasing the temperature in the first heat treatment, an atmosphere in a furnace may be a nitrogen atmosphere, and the atmosphere may be switched to an oxygen atmosphere at the time of performing cooling. By changing the atmosphere to an oxygen atmosphere after the dehydration or dehydrogenation in a nitrogen atmosphere, oxygen can be supplied into the oxide semiconductor layer, so that the hydrogen concentration can be reduced and oxygen can be supplied to the oxygen deficiency formed in the oxide semiconductor layer; accordingly, an i-type or substantially i-type oxide semiconductor layer can be formed.

Further, depending on the conditions of the first heat treatment or the material of the oxide semiconductor layer, the oxide semiconductor layer might be crystallized to be an oxide semiconductor layer including crystals. For example, an oxide semiconductor layer including crystals with a crystallinity of 90% or higher, or 80% or higher, is formed in some cases.

In addition, depending on the conditions of the first heat treatment or the material of the oxide semiconductor layer, the oxide semiconductor layer having a crystal in which the c-axis is approximately parallel to a direction which is perpendicular to a surface is formed in a superficial portion of the amorphous oxide semiconductor layer in some cases.

Here, the substrate is introduced into an electric furnace, and heat treatment is performed in an inert gas atmosphere, such as a nitrogen atmosphere or a rare gas atmosphere, at 450° C. for one hour.

Figure 16C:
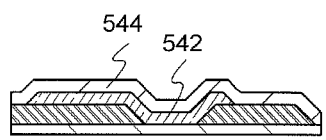

Next, as illustrated in FIG. 16C, the gate insulating layer 544 is formed.

The gate insulating layer 544 can be formed in a manner similar to that of the insulating layer 540. Note that when a silicon oxide layer is formed as the gate insulating layer 544 by a sputtering method, oxygen can be supplied from the silicon oxide layer to the oxygen deficiency which is included in the oxide semiconductor layer 541 and is generated by the first heat treatment, the oxygen deficiency which contributes to the formation of a donor can be reduced, and a structure which satisfies a stoichiometric mixture ratio can be formed. As a result, the i-type or substantially i-type oxide semiconductor layer 542 can be formed. A close contact between the oxide semiconductor layer and the high-quality insulating layer 540 can reduce interface states and produce desirable interface characteristics.

Note that the i-type or substantially i-type oxide semiconductor layer is extremely sensitive to an interface state or interface charge; therefore, formation of the insulating layer 540 by the high density plasma-enhanced CVD using microwaves can reduce interface states and produce desirable interface characteristics.

Then, second heat treatment (preferably, at a temperature higher than or equal to 200° C. and lower than or equal to 400° C., for example, at a temperature higher than or equal to 250° C. and lower than or equal to 350° C.) is preferably performed in an inert gas atmosphere or in an oxygen gas atmosphere. The second heat treatment may be performed after a protective insulating layer or a planarization insulating layer is formed over the gate insulating layer 544. With the heat treatment, oxygen can be supplied from the oxide insulating layer of the gate insulating layer 544 to the oxygen deficiency which is included in the oxide semiconductor layer and is generated by the first heat treatment, the oxygen deficiency which contributes to the formation of a donor can be reduced, and a structure which satisfies a stoichiometric mixture ratio can be formed. As a result, the i-type or substantially i-type oxide semiconductor layer 542 can be formed.

In this embodiment, the second heat treatment is performed at 250° C. for 1 hour in a nitrogen atmosphere.

Figure 16D:
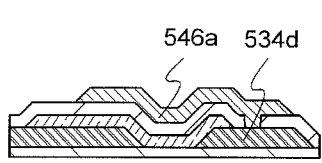

Next, as illustrated in FIG. 16D, after an opening is formed in the gate insulating layer 544, the gate electrode 546*a* is formed over the gate insulating layer 544 and the wiring 534*d*. Through the above steps, a transistor in which the gate electrode 546*a* and the wiring 534*d* are diode-connected can be formed. The gate electrode 546a can be formed in a manner similar to that of the wiring 534c and the wiring 534d.

Figure 16E:
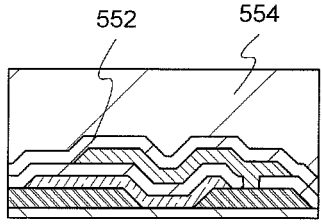

Next, as illustrated in FIG. 16E, the insulating layer 552 and the insulating layer 554 are formed over the gate insulating layer 544 and the gate electrode 546a.

Further, heat treatment may be performed at a temperature higher than or equal to 100° C. and lower than or equal to 200° C. for more than or equal to 1 hour and less than or equal to 30 hours in the air. With the heat treatment, reliability of the transistor can be improved.

Note that in FIGS. 16A to 16E, the oxide semiconductor layer 541 is formed after the wiring 534c and the wiring 534d are formed; however, the wiring 534c and the wiring 534d may be formed after the oxide semiconductor layer 541 is formed over the insulating layer 540.

In FIGS. 16A to 16E, a structure may be employed in which the gate electrode 546a is formed over the insulating layer 540, the gate insulating layer 544 is formed over the gate electrode 546a, the oxide semiconductor layer 541 is formed over the gate insulating layer 544, and wirings functioning as a source electrode and a drain electrode are formed over the oxide semiconductor layer 541. In that case, one of the wirings functioning as a source electrode and a drain electrode is electrically connected to the wiring 534c. Further, the other of the wirings functioning as a source electrode and a drain electrode is electrically connected to the gate electrode 546a.

Through the above steps, the transistor 505 in which a channel region includes the i-type or substantially i-type oxide semiconductor layer and which has very low off-state current can be formed.

(Embodiment 5)

In this embodiment, an embodiment of an RFID tag including the semiconductor memory device described in Embodiments 1 to 4 will be described with reference to drawings.

Figure 17:
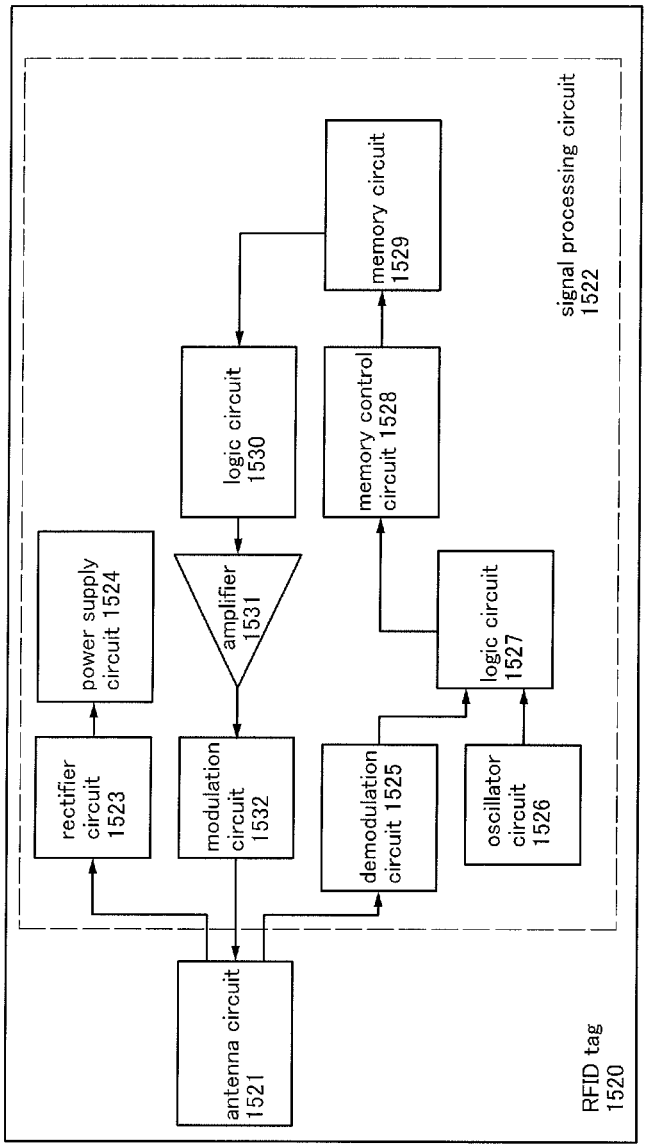
FIG. 17 is a diagram illustrating an RFID tag.

A circuit illustrated in FIG. 17 is an RFID tag. Radio frequency identification (RFID: non-contact automatic identification technique using radio frequency) has features such as capability of reading stored information without contact, operation without a battery, and superiority in durability and weatherability. The reason why operation is possible without a battery is a radio wave (including an operation instruction or the like) received by an antenna included in the RFID tag is rectified in a circuit, so that power can be generated. In the RFID tag, a memory to which data can be written or rewritten by a user is frequently provided in order to improve its function.

An RFID tag 1520 includes an antenna circuit 1521 and a signal processing circuit 1522. The signal processing circuit 1522 includes a rectifier circuit 1523, a power supply circuit 1524, a demodulation circuit 1525, an oscillator circuit 1526, a logic circuit 1527, a memory control circuit 1528, a memory circuit 1529, a logic circuit 1530, an amplifier 1531, and a modulation circuit 1532. The memory circuit 1529 includes the semiconductor memory device of any of the above embodiments.

Communication signals received by the antenna circuit 1521 are input into the demodulation circuit 1525. The frequency of the communication signal received, that is, the frequency of a signal transmitted and received between the antenna circuit 1521 and a reader/writer is, for example, 13.56 MHz, 915 MHz, or 2.45 GHz in UHF (ultra high frequency) band, which is determined on the basis of the ISO standards or the like. Needless to say, the frequency of a signal transmitted and received between the antenna circuit 1521 and the reader/writer is not limited to this, and for example, any of the following frequencies can be used: 300 GHz to 3 THz which is a submillimeter wave, 30 GHz to 300 GHz which is a millimeter wave, 3 GHz to 30 GHz which is a microwave, 300 MHz to 3 GHz which is an ultra high frequency, and 30 MHz to 300 MHz which is a very high frequency. Further, a signal transmitted and received between the antenna circuit 1521 and the reader/writer is a signal obtained by modulating a carrier wave. A carrier wave is modulated by analog modulation or digital modulation, and any of amplitude modulation, phase modulation, frequency modulation, and spread spectrum may be used. Preferably, amplitude modulation or frequency modulation is used.

An oscillation signal output from the oscillator circuit 1526 is supplied as a clock signal to the logic circuit 1527. In addition, the carrier wave which has been modulated is demodulated in the demodulation circuit 1525. The demodulated signal is transmitted to the logic circuit 1527 and analyzed. The signal analyzed in the logic circuit 1527 is transmitted to the memory control circuit 1528. The memory control circuit 1528 controls the memory circuit 1529, extracts data stored in the memory circuit 1529, and transmits the data to the logic circuit 1530. The signal sent to the logic circuit 1530 is amplified by the amplifier 1531 after being encoded by the logic circuit 1530. With the signal amplified by the amplifier 1531, the modulation circuit 1532 modulates a carrier wave. By the modulated carrier wave, the reader/writer recognizes a signal from the RFID tag 1520.

A carrier wave input to the rectifier circuit 1523 is rectified and input to the power supply circuit 1524. Power supply voltage obtained in this manner is supplied from the power supply circuit 1524 to the demodulation circuit 1525, the oscillator circuit 1526, the logic circuit 1527, the memory control circuit 1528, the memory circuit 1529, the logic circuit 1530, the amplifier 1531, the modulation circuit 1532, and the like.

A connection between the signal processing circuit 1522 and the antenna in the antenna circuit 1521 is not specifically limited. For example, the antenna and the signal processing circuit 1522 are connected by wire bonding or bump connection. Alternatively, the signal processing circuit 1522 is formed to have a chip shape and one surface thereof is used as an electrode and attached to the antenna. The signal processing circuit 1522 and the antenna can be attached to each other by the use of an anisotropic conductive film (ACF).

The antenna is either stacked over the same substrate as the signal processing circuit 1522, or formed as an external antenna. Needless to say, the antenna is provided on the above or below of the signal processing circuit.

The rectifier circuit 1523 converts AC signals that are induced by carrier waves received by the antenna circuit 1521 into DC signals.

Figure 18:
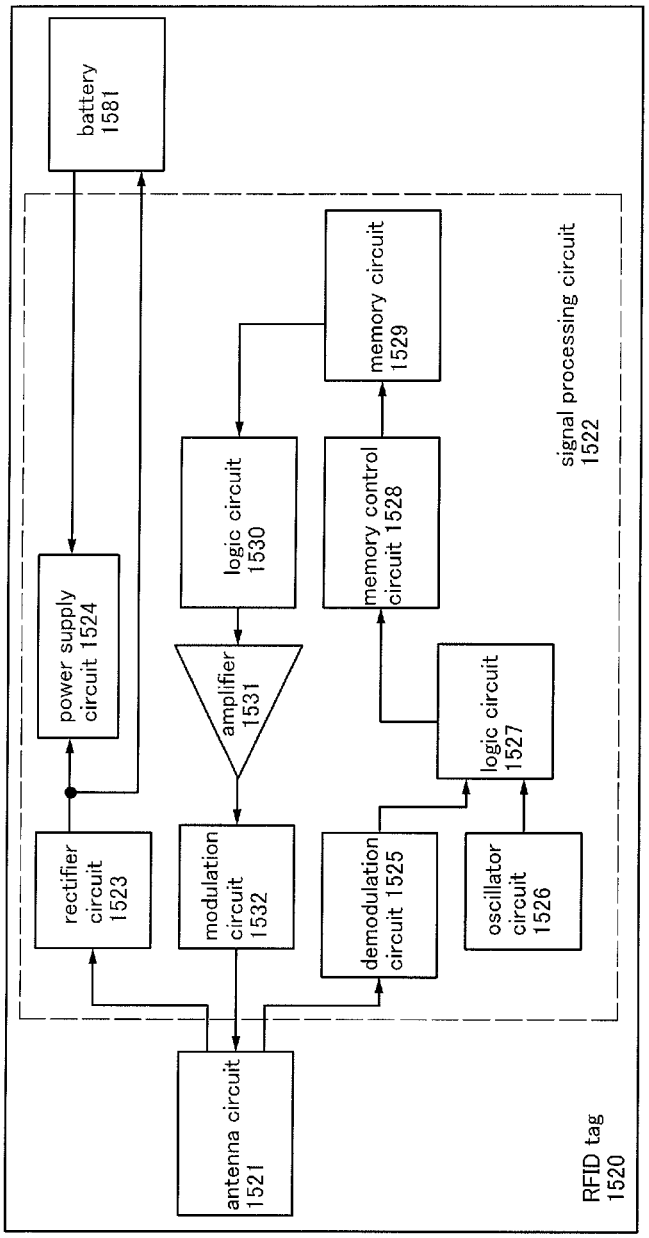
FIG. 18 is a diagram illustrating all RFID tag.

The RFID tag 1520 may include a battery 1581 as illustrated in FIG. 18. When power supply voltage output from the rectifier circuit 1523 is not high enough to operate the signal processing circuit 1522, the battery 1581 also supplies power supply voltage to each circuit of the signal processing circuit 1522, such as the demodulation circuit 1525, the oscillator circuit 1526, the logic circuit 1527, the memory control circuit 1528, the memory circuit 1529, the logic circuit 1530, the amplifier 1531, and the modulation circuit 1532.

Surplus voltage of the power supply voltage output from the rectifier circuit 1523 may be charged in the battery 1581. When an antenna circuit and a rectifier circuit are provided in the RFID tag in addition to the antenna circuit 1521 and the rectifier circuit 1523, energy stored in the battery 1581 can be obtained from electromagnetic waves and the like that are generated randomly.

Electric power is charged in the battery, whereby the RFID tag can be continuously used. As the battery, a battery formed into a sheet form can be used. For example, by using a lithium polymer battery that includes a gel electrolyte, a lithium ion battery, a lithium secondary battery, or the like, a reduction in the size of the battery can be realized. In addition, a nickel-hydrogen battery, a nickel-cadmium battery, a capacitor having high capacitance, or the like can be used as the battery.

(Embodiment 6)

In this embodiment, a use example of the RFID tag 1520 described in Embodiment 5 will be described with reference to drawings.

Figure 19A:
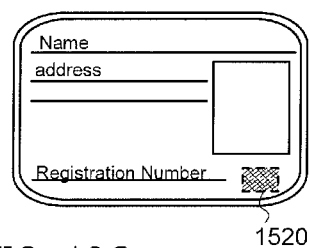
FIGS. 19A to 19F are diagrams illustrating application examples of RFID tags.
Figure 19B:
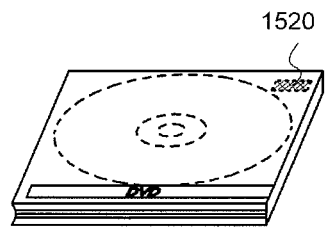
Figure 19C:
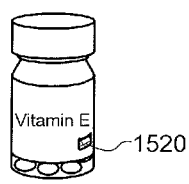
Figure 19D:
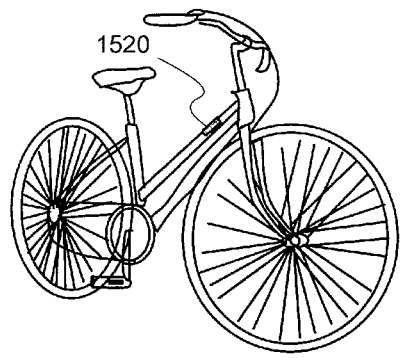
Figure 19E:
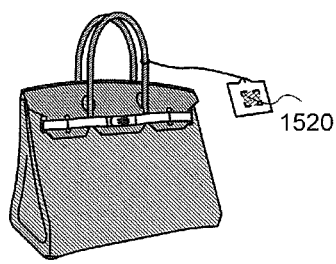
Figure 19F:
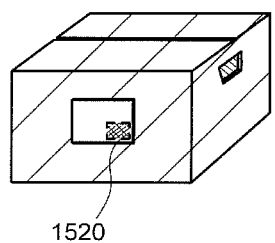

The RFID tag 1520 can be employed for a wide range of uses and can be used by being provided for bills, coins, securities, bearer bonds, certificates (driver's licenses, resident cards, and the like; see FIG. 19A), recording media (DVD software, video tapes, and the like; see FIG. 19B), containers for wrapping objects (wrapping paper, bottles, and the like; see FIG. 19C), vehicles (bicycles and the like; see FIG. 19D), personal belongings (bags, glasses, and the like), foods, plants, animals, human bodies, clothes, daily necessities, or products such as electronic devices (liquid crystal display devices, EL display devices, television units, mobile phones, and the like); tags of each product (see FIGS. 19E and 19F); or the like.

The RFID tag 1520 is fixed to a product by being mounted on a printed board, attached to a surface of the product, or embedded in the product. For example, the RFID tag 1520 is incorporated in paper of a book or an organic resin package to be fixed to each object. Since the RFID tag 1520 can be reduced in size, thickness, and weight, it can be fixed to a product without spoiling the design of the product. Further, bills, coins, securities, bearer bonds, documents, or the like can have an identification function by being provided with the RFID tag 1520, and the identification function can be utilized to prevent counterfeiting. Further, when the RFID tag of the present invention is attached to containers for wrapping objects, recording media, personal belongings, foods, clothes, daily necessities, electronic devices, or the like, a system such as an inspection system can be efficiently used. Vehicles can also have higher security against theft or the like by being provided with the RFID tag 1520.

EXAMPLE 1

In this example, the data retention time of the memory element described in Embodiments 1 to 3 is verified by circuit simulation, and the results are described.

Circuit diagrams for simulation and the results thereof are illustrated in FIGS. 20A to 20C. A circuit illustrated in FIG. 20A is the memory element which is one embodiment of the present invention, and the circuit includes a diode-connected transistor 601, a transistor 602, and a capacitor 603. A circuit for simulation which is equivalent to this circuit is illustrated in FIG. 20B. The circuit illustrated in FIG. 20B includes a resistor 611, a transistor 612, a capacitor 613, a resistor 614, and a resistor 615. The resistor 611 is equivalent to the diode-connected transistor 601 in an off state, and the resistor 614 shows a gate leakage component of the transistor 612, and the resistor 615 shows a leakage component between electrodes of the capacitor 613.

Simulation in which the state just after data is written was assumed and the initial voltage of the node A was 2 V was done. As simulation software, Gateway Version 2.6.12.R produced by Simucad Design automation, Inc. was used. The potential of the node A monotonically decreases over time by the resistor 611 assumed to show the off-state current of the diode-connected transistor 601, the resistor 614 assumed to show the gate leakage component of the transistor 612, and the resistor 615 assumed to show the leakage component between the electrodes of the capacitor 613. The period up until the point when the potential decreases and the off state of the transistor 612 cannot be kept is a period in which data can be held. In this example, a period up until the point when voltage decreases by 10%, that is, decreases to 1.8 V is defined as a period in which data 1 can be held, that is, retention time of data 1.

Under a condition 1 and a condition 2, the resistance value of the resistor 611 was seen as a value of the off-state current of the diode-connected transistor 601 whose channel region was formed using an oxide semiconductor layer. Under a condition 3, the resistance value of the resistor 611 was a value of the off-state current of the diode-connected transistor 601 whose channel region was not formed using an oxide semiconductor layer.

The condition 1: $2\times10^{20} \Omega$ (in terms of off-state current, $10^{-20}$ A);

The condition 2: $2\times10^{19} \Omega$ (in terms of off-state current, $10^{-19}$ A); and The condition 3: $2\times10^{9} \Omega$ (in terms of off-state current, $10^{-9}$ A).

Each of the resistance value of the resistor 614 and the resistance value of the resistor 615 was assumed to be 10 times as large as that of the resistor 611.

FIG. 20C shows the simulation results. FIG. 20C is a graph in which the horizontal axis represents elapsed time and the vertical axis represents the voltage of the node A. The retention time of data 1 under the condition 3 was 176.3 µs, while the retention time of data 1 under the condition 1 was $17.63\times10^{6}$ s (approximately 200 days) and the retention time of data 1 under the condition 2 was $1.763\times10^{6}$ s (approximately 20 days). As a result, it is found that, when the channel region of the diode-connected transistor 601 is formed using an oxide semiconductor layer, data 1 can be held for a significantly long period or time.

EXAMPLE 2

In this example, results obtained by measuring the off-state current of a transistor in which an i-type or substantially i-type oxide semiconductor layer is used for a channel region will be described.

Figure 21:
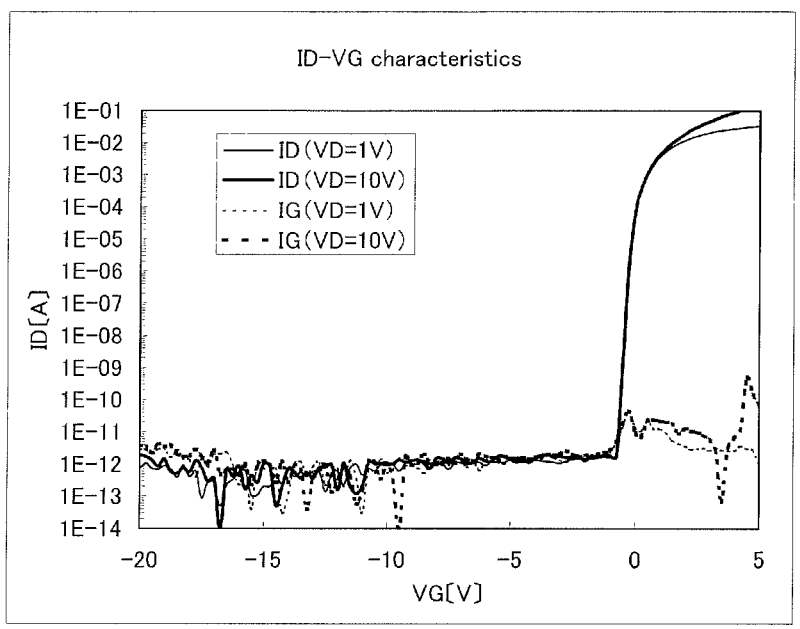
FIG. 21 is a graph showing characteristics of a transistor including an oxide semiconductor.

First, a transistor with a channel width W of 1 m, which was sufficiently large, was prepared in consideration of the very low off-state current of a transistor in which an i-type or substantially i-type oxide semiconductor layer was used for a channel region, and the off-state current was measured. FIG. 21 shows the results obtained by measuring the off-state current of the transistor with a channel width W of 1 m. In FIG. 21, the horizontal axis represents a gate voltage VG and the vertical axis represents a drain current ID. In the case where the drain voltage VD is +1 V or +10 V and the gate voltage VG is within the range of −5 V to −20 V, the off-state current of the transistor was found to be less than or equal to $1\times10^{-12}$ A. Moreover, it is found that the off-state current of the transistor (per unit channel width (1 µm)) is less than or equal to 1aA/µm ($1\times10^{-18}$ A/µm).

Next will be described the results obtained by measuring the off-state current of the transistor in which the i-type or substantially i-type oxide semiconductor layer was used more accurately. As described above, it is found that the off-state current of the transistor in which the i-type or substantially i-type oxide semiconductor layer was used for the channel region is less than or equal to $1\times10^{-12}$ A. Here, the results obtained by measuring more accurate off-state current (the value less than or equal to the detection limit of measurement equipment in the above measurement), with the use of an element for characteristic evaluation, will be described.

First, the element for characteristic evaluation used for a method for measuring current will be described with reference to FIG. 22.

Figure 22:
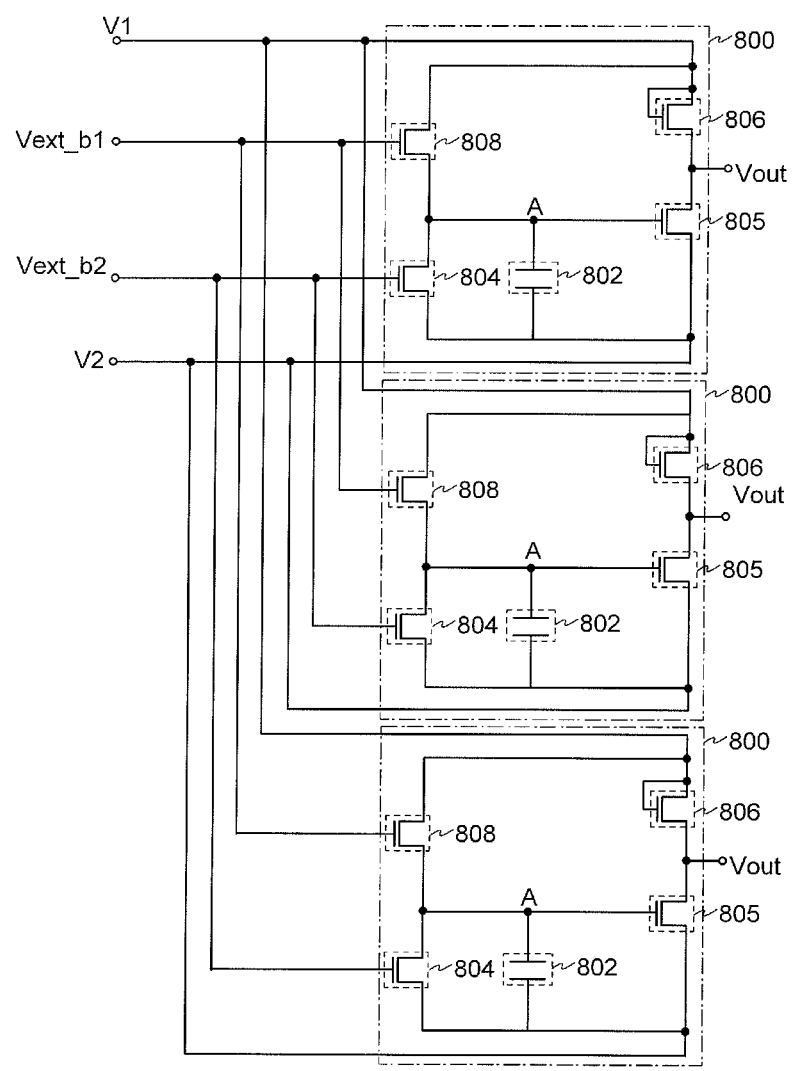
FIG. 22 is a circuit diagram for evaluating characteristics of a transistor including an oxide semiconductor.

In the element for characteristic evaluation illustrated in FIG. 22, three measurement systems 800 are connected in parallel. The measurement system 800 includes a capacitor 802, a transistor 804, a transistor 805, a transistor 806, and a transistor 808. The transistor in which the i-type or substantially i-type oxide semiconductor layer was used for the channel region was used as each of the transistors 804, 805, and 806.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other, and the node serves as an output terminal Vout.

A potential Vext_b2 for controlling an on state and an off state of the transistor 804 is supplied to a gate terminal of the transistor 804. A potential Vext_b1 for controlling an on state and an off state of the transistor 808 is supplied to a gate terminal of the transistor 808. A potential Vout is output from the output terminal.

Next, a method for measuring current with the use of the element for characteristic evaluation will be described.

First, an initialization period in which a potential difference is applied to measure the off-state current will be described briefly. In the initialization period, the potential Vext_b1 for turning on the transistor 808 is input to the gate terminal of the transistor 808, and the potential V1 is supplied to the node A that is a node connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is set to, for example, high. The transistor 804 is off.

After that, the potential Vext_b1 for turning off the transistor 808 is input to the gate terminal of the transistor 808, so that the transistor 808 is turned off. After the transistor 808 is turned off, the potential V1 is set to low. Still, the transistor 804 is off. The potential V2 is the same as the potential V1. Thus, the initialization period is completed. When the initialization period is completed, a potential difference is generated between the node A and one of the source terminal and the drain terminal of the transistor 804. In addition, a potential difference is generated between the node A and the other of the source terminal and the drain terminal of the transistor 808. Accordingly, a small amount of electric charge flows through the transistor 804 and the transistor 808. That is, the off-state current is generated.

Next, a measurement period of the off-state current is briefly described. In the measurement period, the potential (that is, V2) of one of the source terminal and the drain terminal of the transistor 804 and the potential (that is, V1) of the other of the source terminal and the drain terminal of the transistor 808 are fixed to be low. On the other hand, the potential of the node A is not fixed (the node A is in a floating state) in the measurement period. Accordingly, electric charge flows through the transistor 804, and the amount of electric charge stored in the node A varies as time passes. The potential of the node A varies depending on the variation in the amount of electric charge stored in the node A. In other words, the output potential Vout of the output terminal also varies.

Figure 23:
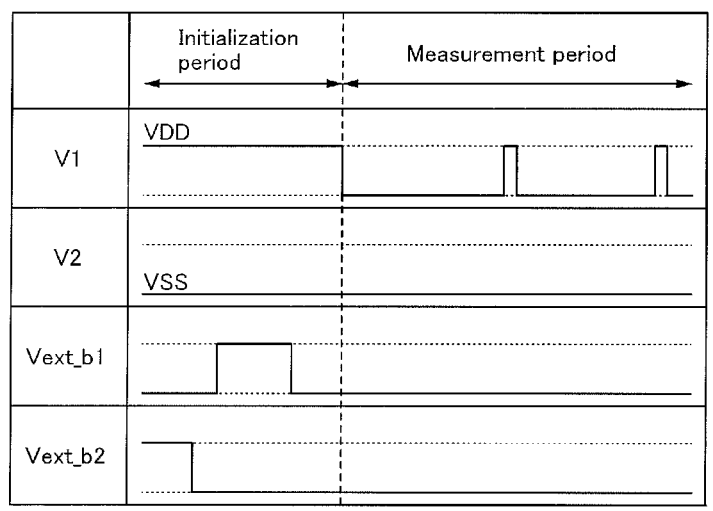
FIG. 23 is a timing chart for evaluating characteristics of a transistor including an oxide semiconductor.

FIG. 23 illustrates details of the relation between potentials in the initialization period in which the potential difference is applied and in the following measurement period (timing chart).

In the initialization period, first, the potential Vext_b2 is set to a potential (high potential) at which the transistor 804 is turned on. Thus, the potential of the node A comes to be V2, that is, a low potential (VSS). After that, the potential Vext_b2 is set to a potential (low potential) at which the transistor 804 is turned off, whereby the transistor 804 is turned off. Next, the potential Vext_b1 is set to a potential (high potential) at which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initialization period is completed.

In the following measurement period, the potential V1 and the potential V2 are individually set to potentials at which electric charge flow to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When the potential difference is generated and the measurement period is started as described above, the amount of electric charge stored in the node A varies as time passes, which changes the potential of the node A. This means that the potential of the gate terminal of the transistor 805 varies; thus, the output potential Vout of the output terminal also varies as time passes.

A method for calculating the off-state current on the basis of the obtained output potential Vout is described below.

The relation between the potential VA of the node A and the output potential Vout is obtained in advance before the off-state current is calculated. With this, the potential VA of the node A can be obtained using the output potential Vout. In accordance with the above relation, the potential VA of the node A can be expressed as a function of the output potential Vout by the following equation.

$$V_A = F(Vout) \quad \text{[formula 1]}$$

Electric charge QA of the node A can be expressed by the following equation with the use of the potential VA of the node A, capacitance CA connected to the node A, and a constant (const). Here, the capacitance CA connected to the node A is the sum of the capacitance of the capacitor 802 and other capacitance.

$$Q_A = C_A V_A + \text{const} \quad \text{[formula 2]}$$

Since a current IA of the node A is obtained by differentiating electric charge flowing to the node A (or electric charge flowing from the node A) with respect to time, the current IA of the node A is expressed by the following equation.

[Formula 3]

$$I_A \equiv \frac{\Delta Q_A}{\Delta t} = \frac{C_A \cdot \Delta F(Vout)}{\Delta t}$$

In this manner, the current IA of the node A can be obtained from the capacitance CA connected to the node A and the output potential Vout of the output terminal.

In accordance with the above method, it is possible to measure leakage current (off-state current) which flows between a source and a drain of a transistor in an off state.

In this example, the transistor 804, the transistor 805, the transistor 806, and the transistor 808 were fabricated using a highly purified oxide semiconductor with a channel length L of 10 μm and a channel width W of 50 μm. In each of the measurement systems 800 arranged in parallel, capacitance values of capacitors 802a, 802b, and 802c were 100 fF, 1 pF, and 3 pF, respectively.

Note that the measurement according to this example was performed assuming that VDD=5 V and VSS=0 V were satisfied. In the measurement period, the potential V1 was basically set to VSS and set to VDD only in a period of 100 msec every 10 to 300 seconds, and Vout was measured. Further, Δt which was used in calculation of current I which flowed through the element was approximately 30000 sec.

Figure 24:
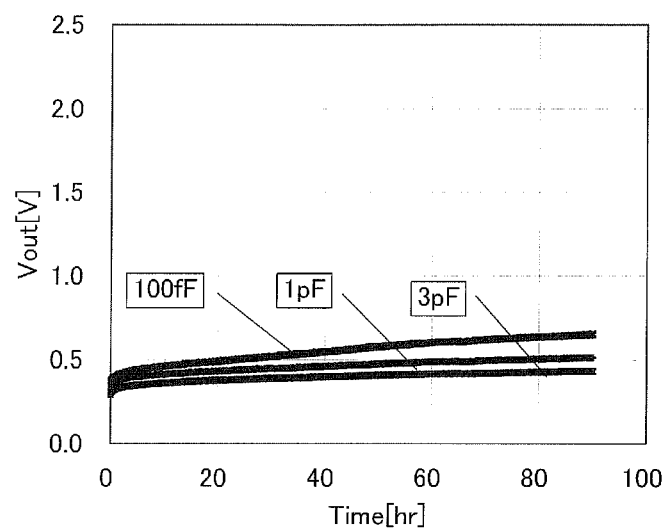
FIG. 24 is a graph showing characteristics of a transistor including an oxide semiconductor.

FIG. 24 shows the relation between elapsed time Time and the output potential Vout in the current measurement. According to FIG. 24, the potential varies as time passes.

Figure 25:
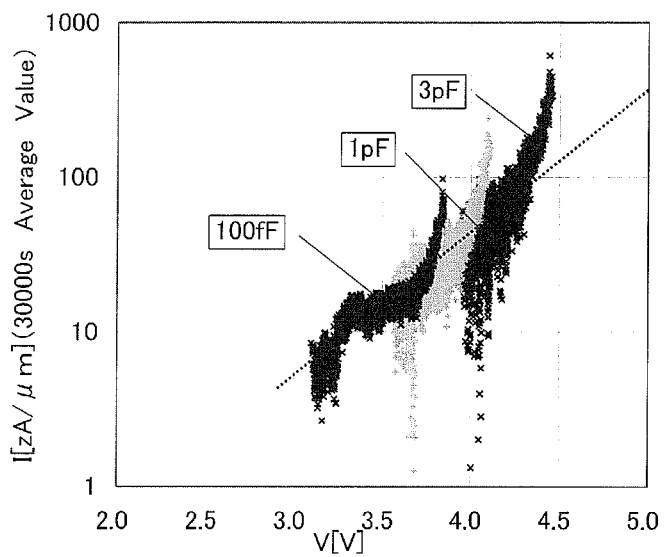
FIG. 25 is a graph showing characteristics of a transistor including an oxide semiconductor.

FIG. 25 shows the off-state current at room temperature (25° C.) calculated based on the above current measurement. FIG. 25 shows the relation between a source-drain voltage V and an off-state current I. According to FIG. 25, it is found that the off-state current was approximately 40 zA/μm under the condition that the source-drain voltage was 4 V. In addition, it is found that the off-state current was less than or equal to 10 zA/μm under the condition that the source-drain voltage was 3.1 V. Note that 1 zA represents $10^{-21}$ A.

Figure 26:
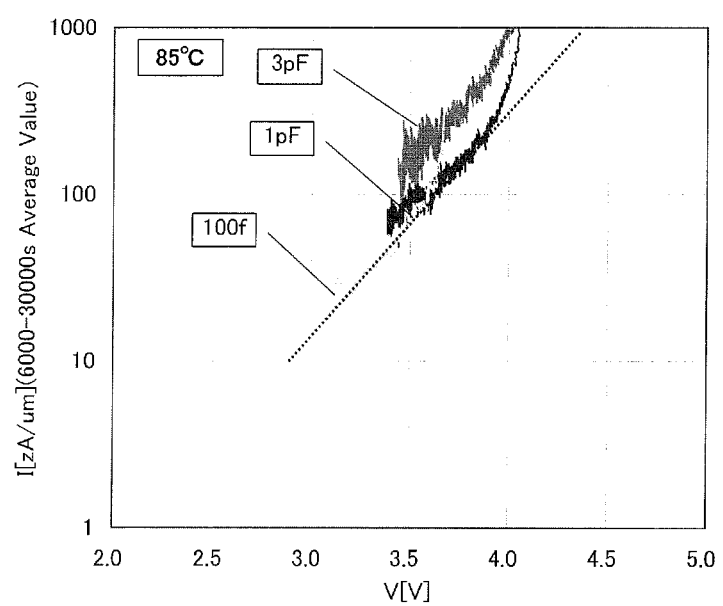
FIG. 26 is a graph showing characteristics of a transistor including an oxide semiconductor.

Further, FIG. 26 shows the off-state current in an environment at a temperature of 85° C., which was calculated based on the above current measurement. FIG. 26 shows the relation between the source-drain voltage V and the off-state current I in an environment at a temperature of 85° C. According to FIG. 26, it is found that the off-state current was less than or equal to 100 zA/μm under the condition that the source-drain voltage was 3.1 V.

According to this example, it was confirmed that the off-state current can be sufficiently low in the transistor in which the i-type or substantially i-type oxide semiconductor layer was used for the channel region. In addition, it is found that the off-state current is also sufficiently low in the diode-connected transistors 102, 112, 122, and 132 in each of which the i-type or substantially i-type oxide semiconductor layer is used for the channel region as described in Embodiments 1 to 3.

This application is based on Japanese Patent Application serial no. 2010-019386 filed with the Japan Patent Office on Jan. 29, 2010, the entire contents of which are hereby incorporated by reference.

The invention claimed is:

1. A semiconductor memory device comprising:
   a memory element including a first transistor, a second transistor, and a capacitor; and
   a readout circuit;
   wherein a gate of the first transistor is electrically connected to one of a source and a drain of the first transistor,
   wherein the other of the source and the drain of the first transistor is electrically connected to a gate of the second transistor,
   wherein the first transistor includes an oxide semiconductor film,
   wherein a first electrode of the capacitor is electrically connected to the gate of the second transistor, and
   wherein one of a source and a drain of the second transistor is electrically connected to the readout circuit.

2. The semiconductor memory device according to claim 1, wherein a potential of a second electrode of the capacitor is a fixed potential.

3. The semiconductor memory device according to claim 1, wherein the semiconductor memory device is a NAND type memory.

4. The semiconductor memory device according to claim 1, wherein carrier density of the oxide semiconductor film is less than $5 \times 10^{14}$ /cm$^3$.

5. The semiconductor memory device according to claim 1,
   wherein the second transistor includes a semiconductor film, and
   wherein a material included in the semiconductor film is different from that included in the oxide semiconductor film.

6. The semiconductor memory device according to claim 1, wherein the semiconductor memory device is a write-once memory.

7. A semiconductor device including the semiconductor memory device according to claim 1.

8. A semiconductor memory device comprising:
   a first wiring;
   a second wiring;
   a third wiring;
   a fourth wiring; and
   a memory element including a first transistor, a second transistor, a third transistor, and a capacitor,
   wherein a gate of the first transistor is electrically connected to one of a source and a drain of the first transistor,
   wherein the other of the source and the drain of the first transistor is electrically connected to a gate of the second transistor,
   wherein one of a source and a drain of the second transistor is electrically connected to the first wiring,
   wherein one of a source and a drain of the third transistor is electrically connected to the gate of the first transistor,
   wherein the other of the source and the drain of the third transistor is electrically connected to the second wiring,
   wherein a gate of the third transistor is electrically connected to the third wiring,
   wherein a first electrode of the capacitor is electrically connected to the gate of the second transistor,
   wherein a second electrode of the capacitor is electrically connected to the fourth wiring, and
   wherein the first transistor includes an oxide semiconductor film.

9. The semiconductor memory device according to claim 8, wherein carrier density of the oxide semiconductor film is less than $5 \times 10^{14}$ /cm$^3$.

10. The semiconductor memory device according to claim 8,
    wherein the second transistor includes a semiconductor film, and
    wherein a material included in the semiconductor film is different from that included in the oxide semiconductor film.

11. The semiconductor memory device according to claim 8, wherein the semiconductor memory device is a write-once memory.

12. A semiconductor device including the semiconductor memory device according to claim 8.

* * * * *

UNITED STATES PATENT AND TRADEMARK OFFICE
CERTIFICATE OF CORRECTION

PATENT NO. : 8,507,907 B2
APPLICATION NO. : 13/015247
DATED : August 13, 2013
INVENTOR(S) : Yasuyuki Takahashi et al.

It is certified that error appears in the above-identified patent and that said Letters Patent is hereby corrected as shown below:

In the Specification

Column 4, line 25, before "RFID" replace "all" with --an--;

Column 13, line 46, replace "lovelier" with --inverter--;

Column 15, line 45, replace "5466" with --546b--;

Column 26, line 18, after "$10^{-20}$" replace "A;" with --A);--.

Signed and Sealed this
Eighteenth Day of February, 2014

Michelle K. Lee
*Deputy Director of the United States Patent and Trademark Office*